US012652789B2

(12) United States Patent
Choi et al.

(10) Patent No.: US 12,652,789 B2
(45) Date of Patent: Jun. 9, 2026

(54) SEMICONDUCTOR DEVICES HAVING LANDING PAD STRUCTURES

(71) Applicant: SAMSUNG ELECTRONICS CO., LTD., Suwon-si (KR)

(72) Inventors: Jinseo Choi, Suwon-si (KR); Sohyang Lee, Suwon-si (KR); Jeongmin Jin, Suwon-si (KR); Sohee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 363 days.

(21) Appl. No.: 18/536,384

(22) Filed: Dec. 12, 2023

(65) Prior Publication Data

US 2024/0276699 A1      Aug. 15, 2024

(30) Foreign Application Priority Data

Feb. 14, 2023     (KR) ........................ 10-2023-0019378

(51) Int. Cl.
H10B 12/00          (2023.01)
(52) U.S. Cl.
CPC ....... H10B 12/0335 (2023.02); H10B 12/315 (2023.02); H10B 12/482 (2023.02)
(58) Field of Classification Search
CPC .............. H10B 12/0335; H10B 12/315; H10B 12/053; H10B 12/34; H10B 12/48; H10B 12/482; H10B 12/485
See application file for complete search history.

(56) References Cited

U.S. PATENT DOCUMENTS

| | | | |
|---|---|---|---|
| 8,030,168 B2 | 10/2011 | Busch et al. | |
| 9,431,324 B2 | 8/2016 | Shin | |
| 9,437,560 B2 | 9/2016 | Park et al. | |
| 11,264,392 B2 * | 3/2022 | Kim ..................... | H10B 12/315 |
| 2021/0210493 A1 * | 7/2021 | Kim ..................... | H10B 12/488 |
| 2022/0037251 A1 | 2/2022 | Park et al. | |
| 2022/0122986 A1 | 4/2022 | Jang et al. | |
| 2022/0139921 A1 | 5/2022 | Kim et al. | |
| 2022/0199623 A1 | 6/2022 | Chen | |
| 2022/0352173 A1 * | 11/2022 | Lee ..................... | H10B 12/315 |

(Continued)

FOREIGN PATENT DOCUMENTS

TW          202230739 A      8/2022

*Primary Examiner* — Bac H Au
(74) *Attorney, Agent, or Firm* — Fish & Richardson P.C.

(57)          ABSTRACT

A semiconductor device includes a substrate having an active region; a gate structure in the substrate, crossing the active region, and extending in a first horizontal direction; bit line structures crossing the gate structure and extending in a second horizontal direction, intersecting the first horizontal direction; a contact plug between the bit line structures; a landing pad structure on the contact plug and including a lower landing pad and an upper landing pad on the lower landing pad, wherein the lower landing pad includes a barrier layer and a metal layer on the barrier layer; and an insulating pattern on the lower landing pad and contacting a side surface of the upper landing pad. The upper landing pad is integrally coupled to the metal layer. A side surface of the insulating pattern includes a concave curved surface toward an adjacent bit line structure among the bit line structures.

20 Claims, 26 Drawing Sheets

(56) References Cited

U.S. PATENT DOCUMENTS

| | | | |
|---|---|---|---|
| 2023/0200054 A1* | 6/2023 | Lee | H10B 12/482 |
| | | | 257/295 |
| 2024/0155831 A1* | 5/2024 | Choi | H10B 12/482 |
| 2024/0155832 A1* | 5/2024 | Choi | H10B 12/0335 |
| 2024/0196600 A1* | 6/2024 | Jin | H10B 12/09 |
| 2024/0306376 A1* | 9/2024 | Lim | H10B 12/09 |
| 2024/0389303 A1* | 11/2024 | Moon | H10B 12/482 |
| 2025/0254857 A1* | 8/2025 | Chae | H10B 12/0335 |

* cited by examiner

'A'

'B'

400

SEMICONDUCTOR DEVICES HAVING LANDING PAD STRUCTURES

CROSS-REFERENCE TO RELATED APPLICATION

This application claims benefit of priority to Korean Patent Application No. 10-2023-0019378, filed on Feb. 14, 2023, in the Korean Intellectual Property Office, the disclosure of which is incorporated herein by reference in its entirety.

BACKGROUND

1. Field

Embodiments relate to a semiconductor device having a landing pad structure.

2. Description of the Related Art

As demands for high performance, high speed, and/or multifunctionality of semiconductor devices increase, a degree of integration of semiconductor devices is increasing. In manufacturing a semiconductor device having a fine pattern corresponding to the trend of the increased degree of integration of the semiconductor devices, it is desired to implement patterns having a fine width or a fine separation distance.

SUMMARY

According to an aspect of embodiments, a semiconductor device includes a substrate including an active region; a gate structure disposed in the substrate, crossing the active region, and extending in a first horizontal direction; bit line structures crossing the gate structure and extending in a second horizontal direction, intersecting the first horizontal direction; a contact plug disposed between the bit line structures; a landing pad structure disposed on the contact plug and including a lower landing pad and an upper landing pad on the lower landing pad, wherein the lower landing pad includes a barrier layer and a metal layer on the barrier layer; and an insulating pattern disposed on the lower landing pad and contacting a side surface of the upper landing pad. The upper landing pad is integrally coupled to the metal layer. A side surface of the insulating pattern includes a concave curved surface toward an adjacent bit line structure among the bit line structures.

According to an aspect of embodiments, a semiconductor device includes a substrate including an active region; a gate structure disposed in the substrate, crossing the active region, and extending in a first horizontal direction; bit line structures crossing the gate structure and extending in a second horizontal direction, intersecting the first horizontal direction; a contact structure disposed between the bit line structures and including a contact plug and a landing pad structure on the contact plug; and an insulating pattern disposed on the contact plug and contacting a side surface of the landing pad structure. A side surface of the insulating pattern includes a concave curved surface toward an adjacent bit line structure among the bit line structures.

According to an aspect of embodiments, a semiconductor device includes a substrate including an active region; a gate structure disposed in the substrate, crossing the active region, and extending in a first horizontal direction; a first bit line structure and a second bit line structure, crossing the gate structure and extending in a second horizontal direction, intersecting the first horizontal direction, wherein the first bit line structure and the second bit line structure are spaced apart from each other in the first horizontal direction; spacer structures covering side surfaces of the first bit line structure and a side surface of the second bit line structure; a first contact plug and a second contact plug, alternately disposed with the first bit line structure and the second bit line structure; a first landing pad structure and a second landing pad structure, respectively disposed on the first contact plug and the second contact plug, wherein the first landing pad structure and the second landing pad structure include a lower landing pad and an upper landing pad on the lower landing pad, respectively, and the lower landing pad includes a barrier layer and a metal layer on the barrier layer; and an insulating pattern disposed between the first landing pad structure and the second landing pad structure. The upper landing pad is integrally coupled to the metal layer. A side surface of the insulating pattern includes a concave curved surface toward the second bit line structure.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, with reference to the accompanying drawings, preferred embodiments will be described as follows.

Figure 1:
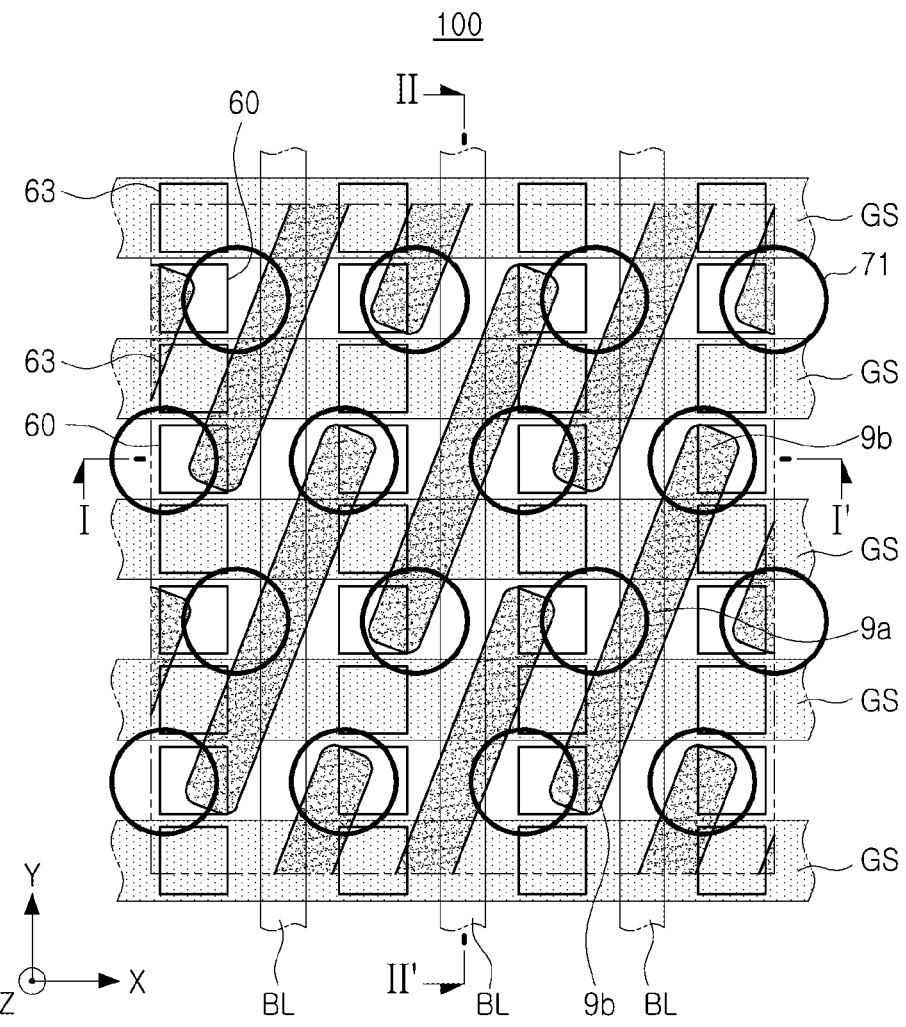
FIG. 1 illustrates a plan view of a semiconductor device according to an example embodiment.
Figure 2:
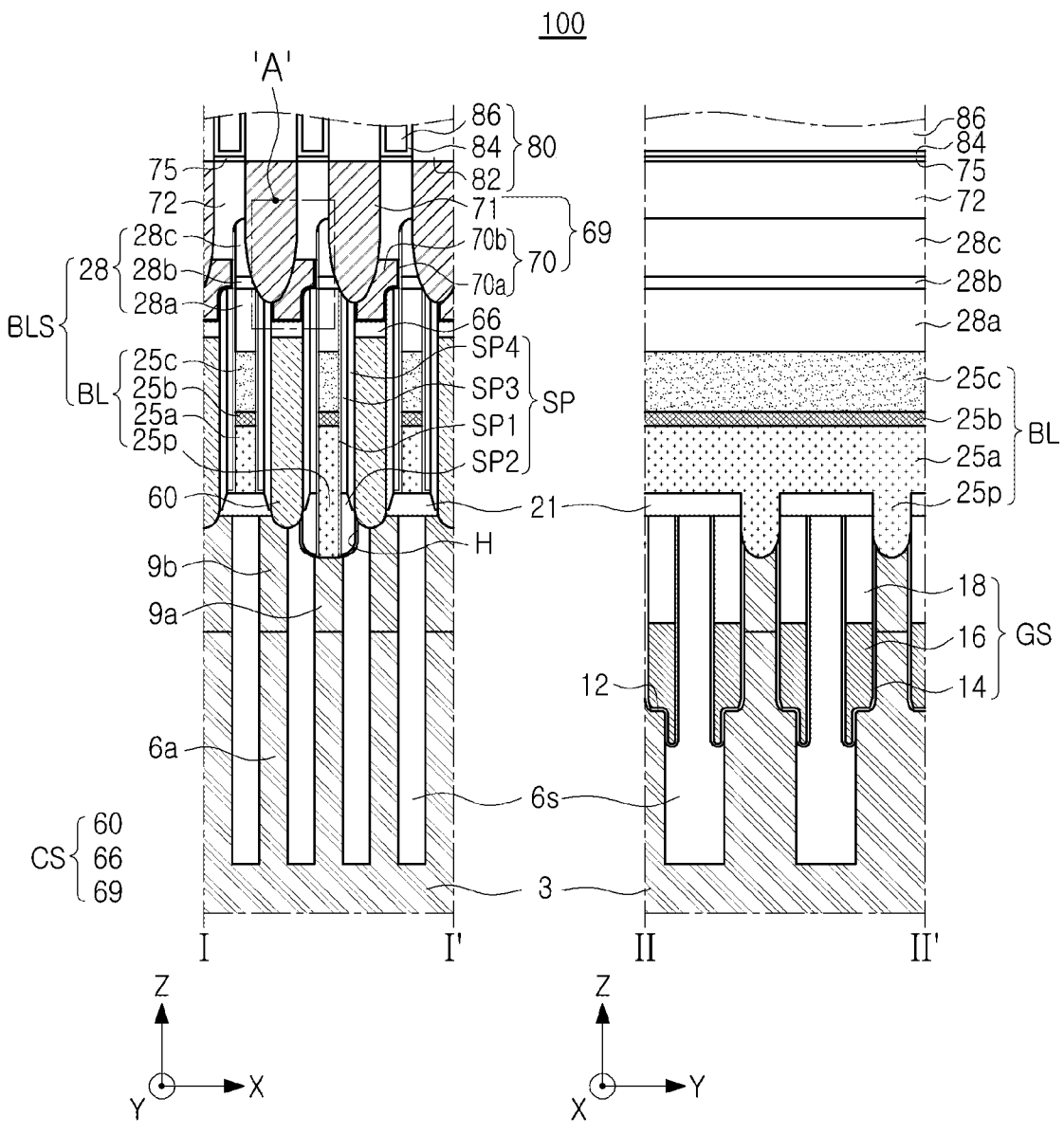
FIG. 2 illustrates cross-sectional views along lines I-I' and II-II' of FIG. 1.

FIG. 1 illustrates a plan view of a semiconductor device according to an example embodiment. FIG. 2 illustrates vertical cross-sectional views of the semiconductor device of FIG. 1, taken along lines I-I' and II-II'.

Referring to FIGS. 1 and 2, a semiconductor device 100 according to an embodiment may include a substrate 3, a gate structure GS, a buffer layer 21, a bit line structure BLS, a spacer structure SP, a contact plug 60, a landing pad structure 69, an insulating pattern 72, and a capacitor structure 80. The semiconductor device 100 may be applied to, e.g., a cell array of a dynamic random access memory (DRAM).

The substrate 3 may include a semiconductor material, e.g., a group IV semiconductor, a group III-V compound semiconductor, or a group II-VI compound semiconductor. For example, the group IV semiconductor may include silicon, germanium, or silicon-germanium. The substrate 3 may be, e.g., a silicon substrate, a silicon-on-insulator (SOI) substrate, a germanium substrate, a germanium-on-insulator (GOI) substrate, a silicon-germanium substrate, or a substrate including an epitaxial layer.

The substrate 3 may include an active region 6a, a device isolation layer 6s, a first impurity region 9a, and a second impurity region 9b. The device isolation layer 6s may be an insulating layer extending downward from an upper surface of the substrate 3, and may define the active region 6a. For example, the active region 6a may correspond to a portion of the upper surface of the substrate 3 surrounded by the device isolation layer 6s. In a plan view, the active region 6a may have a bar shape having a minor axis and a major axis, and may extend in a direction, inclined with respect to an X-direction and a Y-direction.

The active region 6a may include the first and second impurity regions 9a and 9b extending from the upper surface of the substrate 3 by a predetermined depth. The first and second impurity regions 9a and 9b may be spaced apart from each other (e.g., along the active region 6a). The first and second impurity regions 9a and 9b may serve as source/drain regions of a transistor. For example, for one active region 6a, two gate structures GS may cross the one active region 6a, and a drain region may be formed between the two gate structures GS. A source region may be formed in a region, opposite to the drain region, with respect to the two gate structures GS. For example, the first impurity region 9a may correspond to the drain region, and the second impurity region 9b may correspond to the source region. The source region and the drain region may be formed by first and second impurity regions 9a and 9b, using doping or ion implantation of substantially the same impurities, and may be referred to by changing each other, according to a circuit configuration of a transistor to be finally formed. The first and second impurity regions 9a and 9b may include impurities having a conductivity type, opposite to a conductivity type of the substrate 3. For example, the active regions 6a may include P-type impurities, and the first and second impurity regions 9a and 9b may include N-type impurities.

The device isolation layer 6s may extend downward from the upper surface of the substrate 3, and may define the active regions 6a. The device isolation layer 6s may surround the active regions 6a, and may separate the active regions 6a from each other. The device isolation layer 6s may include, e.g., silicon oxide, silicon nitride, silicon oxynitride, or a combination thereof, and may be provided as a single layer or a plurality of layers.

In a plan view, gate structures GS may extend in the X-direction, and may be spaced apart from each other in the Y-direction. In addition, the gate structures GS may cross the active region 6a. For example, two gate structures GS may cross one active region 6a. Transistors respectively including the gate structure GS and the first and second impurity regions 9a and 9b may constitute a buried channel array transistor (BCAT).

In a cross-sectional view, the gate structures GS may be buried in the substrate 3, and for example, the gate structures GS may be disposed in an internal space of a gate trench 12 formed in the substrate 3. The gate structure GS may include a gate dielectric layer 14, a gate electrode 16, and a gate capping layer 18, disposed in the internal space of the gate trench 12. The gate dielectric layer 14 may be conformally formed on an inner wall of the gate trench 12. The gate electrode 16 may be disposed in a lower portion of the gate trench 12, and the gate capping layer 18 may be disposed in an upper portion of the gate structure GS, and may fill the gate trench 12. A portion of an upper surface of the gate capping layer 18 may be coplanar with an upper surface of the device isolation layer 6s, and a portion of the upper surface of the gate capping layer 18 may have a concave curved surface in an upward direction.

The gate dielectric layer 14 may include silicon oxide or a material having a high dielectric constant. In example embodiments, the gate dielectric layer 14 may be a layer formed by oxidation of the active region 6a or a layer formed by deposition. The gate electrode 16 may include a conductive material, e.g., at least one of polycrystalline silicon (Si), titanium (Ti), titanium nitride (TiN), tantalum (Ta), tantalum nitride (TaN), tungsten (W), tungsten nitride (WN)), or aluminum (Al). The gate capping layer 18 may include, e.g., silicon nitride.

The buffer layer 21 may be disposed on the active region 6a, the device isolation layer 6s, and the gate structure GS. The buffer layer 21 may include, e.g., silicon oxide, silicon nitride, silicon oxynitride, or a combination thereof. The buffer layer 21 may be provided as a single layer or a plurality of layers.

The bit line structures BLS may extend in the Y-direction, and may be spaced apart from each other in the X-direction. The bit line structure BLS may have a bar shape extending in the Y-direction. The bit line structure BLS may include a bit line BL and a bit line capping layer 28 on the bit line BL. The bit line BL may include a first conductive layer 25a, a second conductive layer 25b, and a third conductive layer 25c, sequentially stacked on the buffer layer 21. The first conductive layer 25a may include, e.g., polysilicon. The second conductive layer 25b may include a metal-semiconductor compound. The metal-semiconductor compound may be, e.g., a layer obtained by silicidizing a portion of the first conductive layer 25a. For example, the metal-semiconductor compound may include cobalt silicide (CoSi), titanium silicide (TiSi), nickel silicide (NiSi), tungsten silicide (WSi), or another metal silicide, or may include a nitride, e.g., TiSiN. The third conductive layer 25c may include a metal material, e.g., titanium (Ti), tantalum (Ta), tungsten (W), or aluminum (Al). The bit line BL may further include a plug portion 25p disposed below the first conductive layer 25a and extending downward to contact the first impurity region 9a. The plug portion 25p may be located in a contact hole H formed on the upper surface of the substrate 3. In a plan view, the plug portion 25p may be in contact with a central portion of the active region 6a. The plug portion 25p may electrically connect the active region 6a to the bit line structure BLS. The plug portion 25p may include a material, identical to a material of the first conductive layer 25a.

The bit line capping layer 28 may include a first insulating layer 28a, a second insulating layer 28b, and a third insulating layer 28c, disposed on the bit line BL. A side surface of the first insulating layer 28a may be coplanar with the first conductive layer 25a, the second conductive layer 25b, and the third conductive layer 25c. The first insulating layer 28a, the second insulating layer 28b, and the third insulating layer 28c may include, e.g., silicon oxide, silicon nitride, silicon oxynitride, or a combination thereof.

Spacer structures SP may be disposed on both (e.g., opposite) side surfaces of the bit line structures BLS, and may extend in the Y-direction along the side surfaces of the bit line structures BLS. The spacer structures SP may include a first spacer SP1, a second spacer SP2, a third spacer SP3, and a fourth spacer SP4, disposed on the side surfaces of the bit line structures BLS. The first spacer SP1 may be conformally disposed along the, e.g., entire, side surfaces of the bit line structure BLS and a side surface of the contact hole H. The second spacer SP2 may be disposed on the first spacer SP1, and may fill the contact hole H. The third spacer SP3 may cover a side surface of the first spacer SP1 (e.g., above the second spacer SP2), and the fourth spacer SP4 may cover a side surface of the third spacer SP3. The third spacer SP3 and the fourth spacer SP4 may cover an upper surface of the second spacer SP2. The first spacer SP1, the second spacer SP2, the third spacer SP3, and the fourth spacer SP4 may include, e.g., silicon oxide, silicon nitride, silicon oxynitride, or a combination thereof. The spacer structure SP is illustrative, and materials and the number of layers are not limited thereto, and may be variously changed.

The contact plug 60 may be disposed between the bit line structures BLS, and may be in contact with the spacer structures SP. In a plan view, the contact plugs 60 may be disposed between the bit line structures BLS and between the gate structures GS.

A lower end of the contact plug 60 may be located on a level, lower than the upper surface of the substrate 3, and an upper surface of the contact plug 60 may be located on a level, lower than an upper end of the bit line structure BLS. For example, a distance between the lowermost end of the contact plug 60 and the bottom of the substrate 3 may be smaller than a distance between the upper surface of the substrate 3 and the bottom of the substrate 3. For example, a distance between an upper surface of the contact plug 60 and the bottom of the substrate 3 may be smaller than a distance between the upper end of the bit line structure BLS and the bottom of the substrate 3.

The contact plug 60 may extend into the substrate 3 to contact the second impurity region 9b of the active region 6a, and may be electrically connected to the second impurity region 9b. The contact plug 60 may be formed of a conductive material, and may include, e.g., at least one of polysilicon (Si), titanium (Ti), titanium nitride (TiN), tantalum (Ta), tantalum nitride (TaN), tungsten (W), tungsten nitride (WN), or aluminum (Al). In an embodiment, the contact plug 60 may include doped polysilicon, and may include an N-type impurity, e.g., phosphorus (P), arsenic (As), or antimony (Sb).

The semiconductor device 100 may further include a fence structure 63 disposed between the bit line structures BLS. As illustrated in FIG. 1, the fence structures 63 may overlap the gate structures GS in a vertical direction, and may be alternately disposed with the contact plugs 60 in the Y-direction. The fence structures 63 may spatially separate the contact plugs 60 from each other, and may electrically insulate the contact plugs 60 from each other. The fence structure 63 may have a bar shape or a column shape extending in a vertical direction. A lower surface of the fence structure 63 may be in contact with the gate capping layer 18 of the gate structure GS. The fence structure 63 may include an insulating material, e.g., silicon nitride.

The semiconductor device 100 may further include a metal-semiconductor compound layer 66 disposed on the upper surface of the contact plug 60. The metal-semiconductor compound layer 66 may be in contact with a side surface of the spacer structure SP. The metal-semiconductor compound layer 66 may be formed by silicidizing a portion of the contact plug 60 including polysilicon. The metal-semiconductor compound layer 66 may include, e.g., cobalt silicide (CoSi), titanium silicide (TiSi), nickel silicide (NiSi), tungsten silicide (WSi), or other metal silicide.

Figure 3:
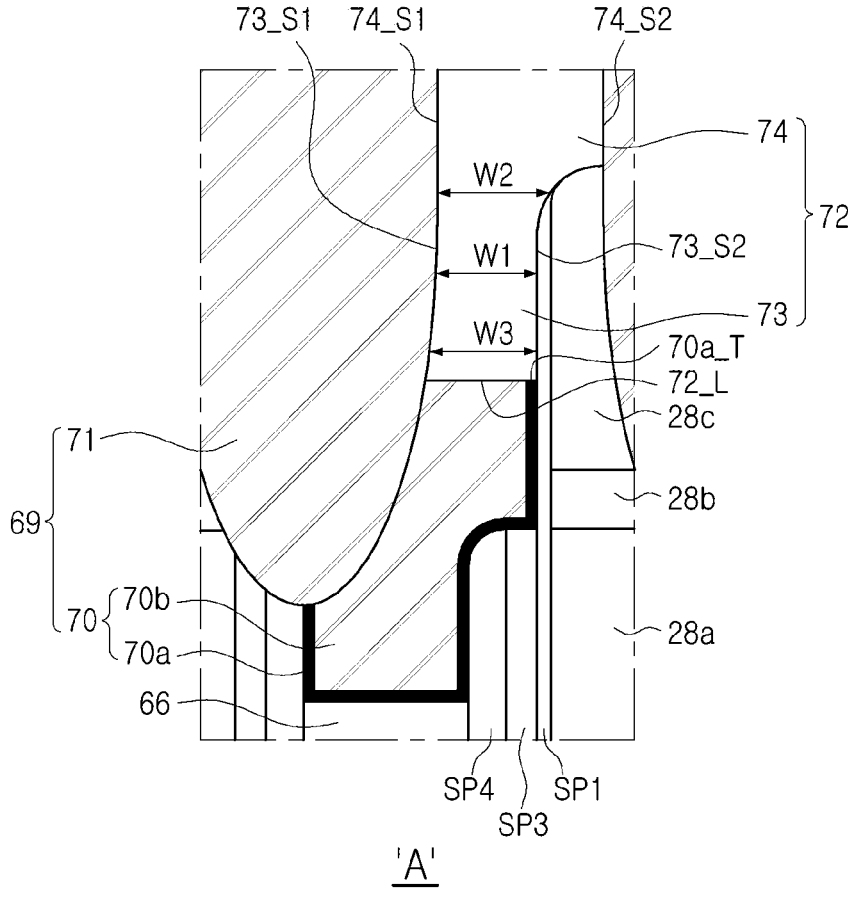
FIG. 3 illustrates a partially enlarged view of region A of FIG. 1.

FIG. 3 is a partially enlarged view of portion A of FIG. 2.

Referring to FIGS. 2 and 3, the landing pad structure 69 may be disposed on the metal-semiconductor compound layer 66. The landing pad structure 69 may include a lower landing pad 70 and an upper landing pad 71. The upper landing pad 71 may be electrically connected to the lower landing pad 70, and the landing pad structure 69 may be electrically connected to the second impurity region 9b of the active region 6a through the contact plug 60. For example, as illustrated in FIG. 2, the lower landing pad 70 may be between the upper landing pad 71 and the contact plug 60.

The lower landing pad 70 may include a barrier layer 70a and a metal layer 70b on the barrier layer 70a. The barrier layer 70a may cover an upper surface of the metal-semiconductor compound layer 66, and may partially cover the side surface of the spacer structure SP. For example, as illustrated in FIG. 2, the barrier layer 70a may not extend on the upper surface of the metal layer 70b. For example, an upper end 70a_T of the barrier layer 70a may be coplanar with an upper surface of the metal layer 70b, e.g., the upper end 70a_T of the barrier layer 70a may be horizontally spaced apart from the upper landing pad 71. The upper end 70a_T of the barrier layer 70a and the upper surface of the metal layer 70b may be located on a level lower than an upper end of the bit line structure BLS. For example, the upper end 70a_T of the barrier layer 70a and the upper surface of the metal layer 70b may be located on a level lower than an upper surface of the third insulating layer 28c, e.g., a distance between the upper end 70a_T of the barrier layer 70a and the bottom surface of the substrate 3 may be smaller than a distance between the upper surface of the third insulating layer 28c and the bottom of the substrate 3.

The barrier layer 70a may include a metal nitride, e.g., at least one of titanium nitride (TiN), tantalum nitride (TaN), or tungsten nitride (WN). The metal layer 70b may include a conductive material, e.g., at least one of titanium (Ti), tantalum (Ta), tungsten (W), molybdenum (Mo), or aluminum (Al).

The upper landing pad 71 may be disposed on the lower landing pad 70, e.g., the lower landing pad 70 may extend vertically from the metal-semiconductor compound layer 66 toward a bottom of the upper landing pad 71 and may partially overlap a lower portion of a sidewall of the upper landing pad 71. In an embodiment, the upper landing pad 71 may extend in a vertical direction by partially passing through the bit line structure BLS. For example, the upper landing pad 71 may be in direct contact with the bit line structure BLS, and may partially overlap the bit line structure BLS in a vertical direction. The upper landing pad 71 may also partially pass through the spacer structure SP. The upper landing pad 71 may be in direct contact with the spacer structure SP, and may partially overlap the spacer structure SP in a vertical direction. The barrier layer 70a may not be interposed between the upper landing pad 71 and the bit line structure BLS and between the upper landing pad 71 and the spacer structure SP.

The upper landing pad 71 may include a material identical to a material of the metal layer 70b of the lower landing pad 70. For example, the upper landing pad 71 may include at least one of titanium (Ti), tantalum (Ta), tungsten (W), molybdenum (Mo), or aluminum (Al). In an embodiment, a boundary surface between the upper landing pad 71 and the metal layer 70b may not be observed, and the upper landing pad 71 may form a single layer with the metal layer 70b. For example, the upper landing pad 71 may be integrally coupled to the metal layer 70*b* to form a single and seamless structure. The contact plug 60, the metal-semiconductor compound layer 66, and the landing pad structure 69 may constitute a contact structure CS.

The insulating pattern 72 may be disposed between the landing pad structures 69. For example, the insulating pattern 72 may be disposed on the lower landing pad 70, and may be disposed between the upper landing pads 71, e.g., so the insulating pattern 72 may directly contact a top surface of the lower landing pad 70 and sidewalls of adjacent upper landing pads 71. The insulating pattern 72 may spatially separate the landing pad structures 69 from each other, and may electrically insulate the landing pad structures 69 from each other. In a cross-sectional view, each insulating pattern 72 may be in contact with two landing pad structures 69, and contact areas of one insulating pattern 72 with each of the two landing pad structures 69 may be different from each other.

The insulating pattern 72 may include a first portion 73 and a second portion 74 on the first portion 73. The first portion 73 may refer to one portion of the insulating pattern 72 located at a level lower than the upper end of the bit line structure BLS, and the second portion 74 may refer to a different portion of the insulating pattern 72 located at a level higher than the upper end of the bit line structure BLS. A horizontal width of the first portion 73 may be narrower than a horizontal width of the second portion 74 (e.g., in the X direction). An upper surface of the insulating pattern 72 may be coplanar with an upper surface of the upper landing pad 71. For example, an upper surface of the second portion 74 may be coplanar with the upper surface of the upper landing pad 71. A lower surface 72_L of the insulating pattern 72 may be in contact (e.g., direct contact) with the lower landing pad 70. For example, a lower surface of the first portion 73 may be in direct contact with an upper end 70*a*_T of the barrier layer 70*a* and an upper surface of the metal layer 70*b*. The lower surface of the first portion 73 may be a flat surface, e.g., may be parallel to the bottom of the substrate 3, and may extend in the X-direction and the Y-direction. The lower surface 72_L of the insulating pattern 72 may be located at a level higher than a lower end of the upper landing pad 71, e.g., relative to the bottom of the substrate 3.

The first portion 73 may include a first side surface 73_S1 and a second side surface 73_S2, opposite to each other (e.g., in the X-direction), and the second portion 74 may include a first side surface 74_S1 and a second side surface 74_S2, opposite to each other (e.g., in the X-direction). The first side surface 73_S1 of the first portion 73 may be connected to the first side surface 74_S1 of the second portion 74, and the second side surface 73_S2 of the first portion 73 may be connected to the second side surface 74_S2 of the second portion 74. The first side surface 73_S1 of the first portion 73 and the first side surface 74_S1 of the second portion 74 may be in direct contact with the upper landing pad 71. The second side surface 73_S2 of the first portion 73 may be in contact (e.g., direct contact) with the spacer structure SP and the bit line structure BLS, and the second side surface 74_S2 of the second portion 74 may be in direct contact with the upper landing pad 71. In an embodiment, a side surface of the insulating pattern 72 may include a concave curved surface toward the upper landing pad 71 (e.g., concave relative to a center of the insulating pattern 72). For example, the first side surface 73_S1 of the first portion 73 and the first side surface 74_S1 of the second portion 74 may include a concave curved surface toward the upper landing pad 71, respectively. The second side surface 73_S2 of the first portion 73 may include a concave curved surface toward the bit line structure BLS and the spacer structure SP, and the second side surface 74_S2 of the second portion 74 may include a concave curved surface toward the upper landing pad 71. The first portion 73 may have a first horizontal width W1 at a first level between an upper surface of the lower landing pad 70 and the upper end of the bit line structure BLS, may have a second horizontal width W2 at a second level, higher than the first level, and may have a third horizontal width W3 at a third level, lower than the first level. The first horizontal width W1 may be narrower than each of the second horizontal width W2 and the third horizontal width W3. A horizontal width of the second portion 74 may decrease upwardly in a vertical direction. The insulating pattern 72 may include, e.g., silicon oxide, silicon nitride, silicon oxynitride, or a combination thereof. For example, the insulating pattern 72 may include silicon nitride.

Referring back to FIG. 2, the semiconductor device 100 may further include an etch stop layer 75 covering the upper surface of the insulating pattern 72. The capacitor structure 80 may be disposed on the landing pad structure 69 and the insulating pattern 72. The capacitor structure 80 may include a lower electrode 82, a capacitor dielectric layer 84, and an upper electrode 86. The lower electrode 82 may pass through the etch stop layer 75, and may be in contact with the upper surface of the landing pad structure 69. The capacitor dielectric layer 84 may cover the lower electrode 82 and the etch stop layer 75, and the upper electrode 86 may cover the capacitor dielectric layer 84. The capacitor structure 80 may be electrically connected to the landing pad structure 69 and the contact plug 60. The lower electrode 82 and the upper electrode 86 may include at least one of, e.g., a doped semiconductor, a metal nitride, a metal, or a metal oxide. The lower electrode 82 and the upper electrode 86 may include, e.g., at least one of polycrystalline silicon, titanium nitride (TiN), tungsten (W), titanium (Ti), ruthenium (Ru), or tungsten nitride (WN). The capacitor dielectric layer 84 may include, e.g., at least one of high dielectric constant materials, e.g., zirconium oxide ($ZrO_2$), aluminum oxide ($Al_2O_3$), or hafnium oxide ($Hf_2O_3$).

Figure 4:
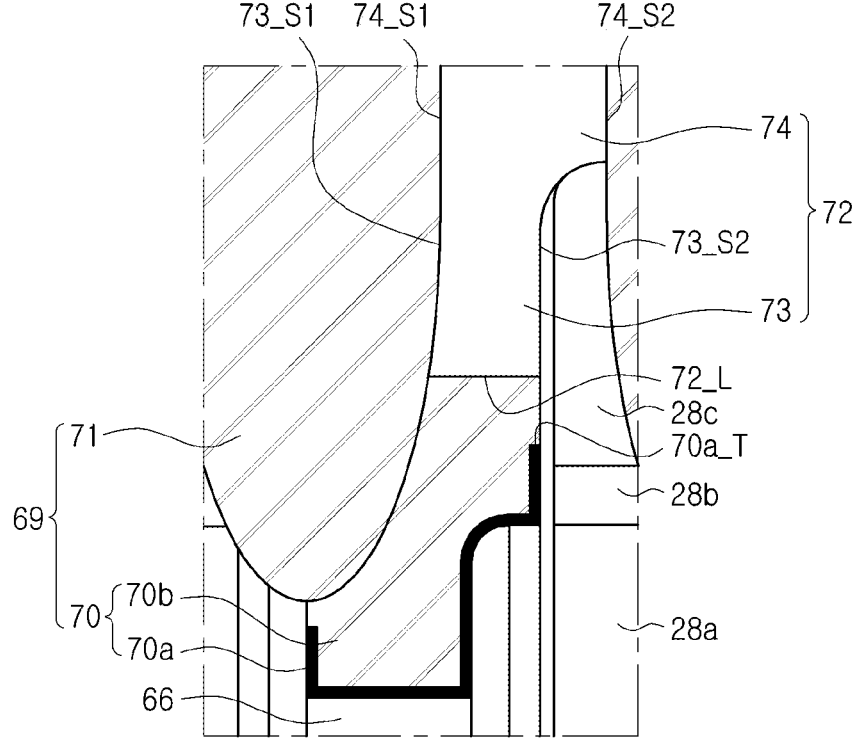
FIG. 4 illustrates a partially enlarged view of region A of FIG. 1 according to another example embodiment.

FIG. 4 illustrates a vertical cross-sectional views of a semiconductor device according to another example embodiment. FIG. 4 corresponds to the view illustrated in FIG. 3.

Referring to FIG. 4, in an embodiment, an upper end 70*a*_T of a barrier layer 70*a* may be located at a level lower than an upper surface of the metal layer 70*b*. The upper end 70*a*_T of the barrier layer 70*a* may not be in contact with the insulating pattern 72, and may be spaced apart from the insulating pattern 72. The barrier layer 70*a* may also not be in contact with the upper landing pad 71.

FIGS. 5 to 12 are vertical cross-sectional views in a process sequence illustrating stages in a method of manufacturing the semiconductor device 100 according to an example embodiment. Specifically, FIGS. 5 to 12 are vertical cross-sectional views of FIG. 1, taken along lines I-I' and II-II'.

Figure 5:
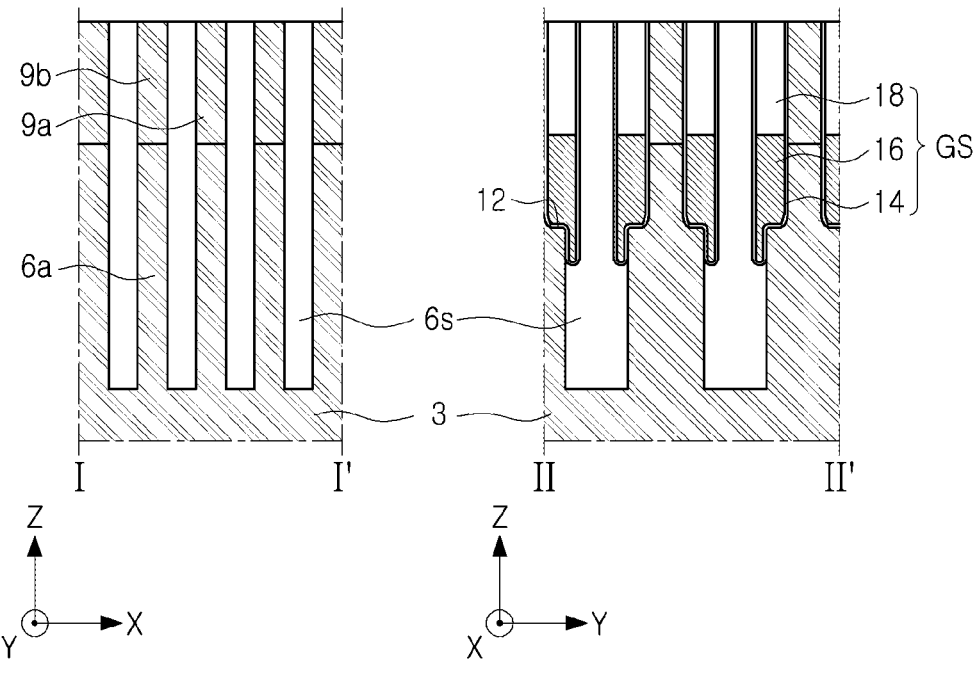
FIGS. 5 to 12 are vertical cross-sectional views of stages in a method of manufacturing a semiconductor device according to an example embodiment.

Referring to FIG. 5, the device isolation layer 6*s* and the gate structure GS may be formed in the substrate 3. The device isolation layer 6*s* may be prepared by forming a trench on an upper surface of the substrate 3, filling the trench with an insulating material, and performing a planarization process of etching the substrate 3 and the insulating material. The device isolation layer 6*s* may define the active regions 6*a*. For example, the active regions 6*a* may correspond to a portion of the upper surface of the substrate 3 surrounded by the device isolation layer 6s. In a plan view, the active regions 6a may have a bar shape having a minor axis and a major axis, respectively, and may be spaced apart from each other. The device isolation layer 6s may be provided as a single layer or a plurality of layers.

In an embodiment, impurity regions may be formed by implanting impurities into the substrate 3 before the device isolation layer 6s is formed. According to example embodiments, the impurity regions may be formed after the device isolation layer 6s is formed or in other processes.

Thereafter, the substrate 3 may be anisotropically etched to form gate trenches 12. The gate trenches 12 may extend in the X-direction, and may cross the active region 6a and the device isolation layer 6s. The gate structure GS may be prepared by forming the gate dielectric layer 14, the gate electrode 16, and the gate capping layer 18, in the gate trench 12. The gate dielectric layer 14 may be conformally formed on an inner wall of the gate trench 12. The gate electrode 16 may be prepared by forming a conductive material on the gate dielectric layer 14 and then recessing the conductive material. The gate capping layer 18 may be prepared by forming an insulating material on the gate electrode 16 to fill the gate trench 12 and then performing a planarization process. In an embodiment, as illustrated in FIG. 5, the gate trench 12 may be formed deeper in the device isolation layer 6s than in the active region 6a.

Figure 6:
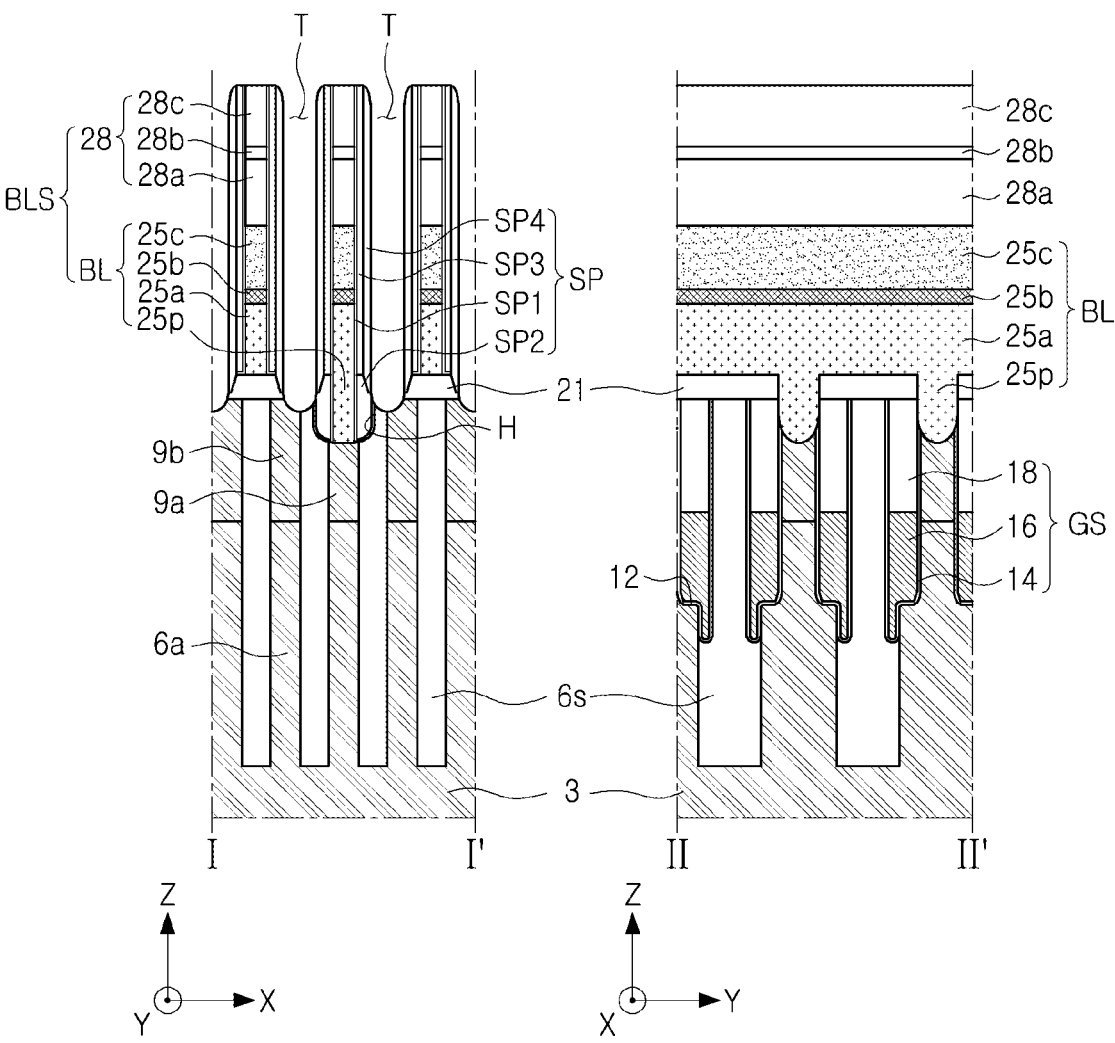

Referring to FIG. 6, the buffer layer 21, the bit line structure BLS, and the spacer structure SP may be formed on the substrate 3. The buffer layer 21 may be formed on the upper surface of the substrate 3, an upper surface of the active region 6a, an upper surface of the device isolation layer 6s, and an upper surface of the gate structure GS. The buffer layer 21 may be provided as a single layer or a plurality of layers.

The bit line structure BLS may be formed on the buffer layer 21. The bit line structure BLS may be prepared by etching the buffer layer 21 to expose the active region 6a, to form a contact hole H, stacking conductive material layers in the contact hole H, forming insulating material layers on the conductive material layers, and patterning the conductive material layers and the insulating material layers. For example, the conductive material layers and the insulating material layers may be patterned to form trenches extending in the Y-direction and spaced apart from each other in the X-direction. An upper surface of the active region 6a may be partially exposed by the patterning process. The bit line structures BLS may extend in the Y-direction, and may be spaced apart from each other in the X-direction.

The bit line structure BLS may include eth bit line BL including a conductive material and the bit line capping layer 28 including an insulating material. The bit line BL may include the first conductive layer 25a, the second conductive layer 25b, and the third conductive layer 25c, sequentially stacked, and the first conductive layer 25a may include the plug portion 25p disposed in the contact hole H. The bit line capping layer 28 may include the first insulating layer 28a, the second insulating layer 28b, and the third insulating layer 28c, sequentially stacked.

The spacer structure SP may be formed on both side surfaces of the bit line structure BLS. The spacer structure SP may include the first spacer SP1, the second spacer SP2, the third spacer SP3, and the fourth spacer SP4. The first spacer SP1 may be formed by conformally depositing an insulating material along a side surface of the bit line structure BLS and an inner wall of the contact hole H. The second spacer SP2 may be formed by depositing an insulating material on the first spacer SP1 to fill the contact hole H. The third spacer SP3 and the fourth spacer SP4 may be formed by forming an insulating material to cover the second spacer SP2 and a side surface of the third spacer SP3 and etching the insulating material. The spacer structure SP may extend in the Y-direction along the side surface of the bit line structure BLS.

After the spacer structure SP is formed, a process of etching the buffer layer 21 may be performed to expose the upper surface of the active region 6a. A space between the bit line structures BLS may be referred to as a trench T. For example, the trench T may be defined by mutually facing side surfaces of adjacent spacer structures SP, and may extend in the Y-direction.

Figure 7:
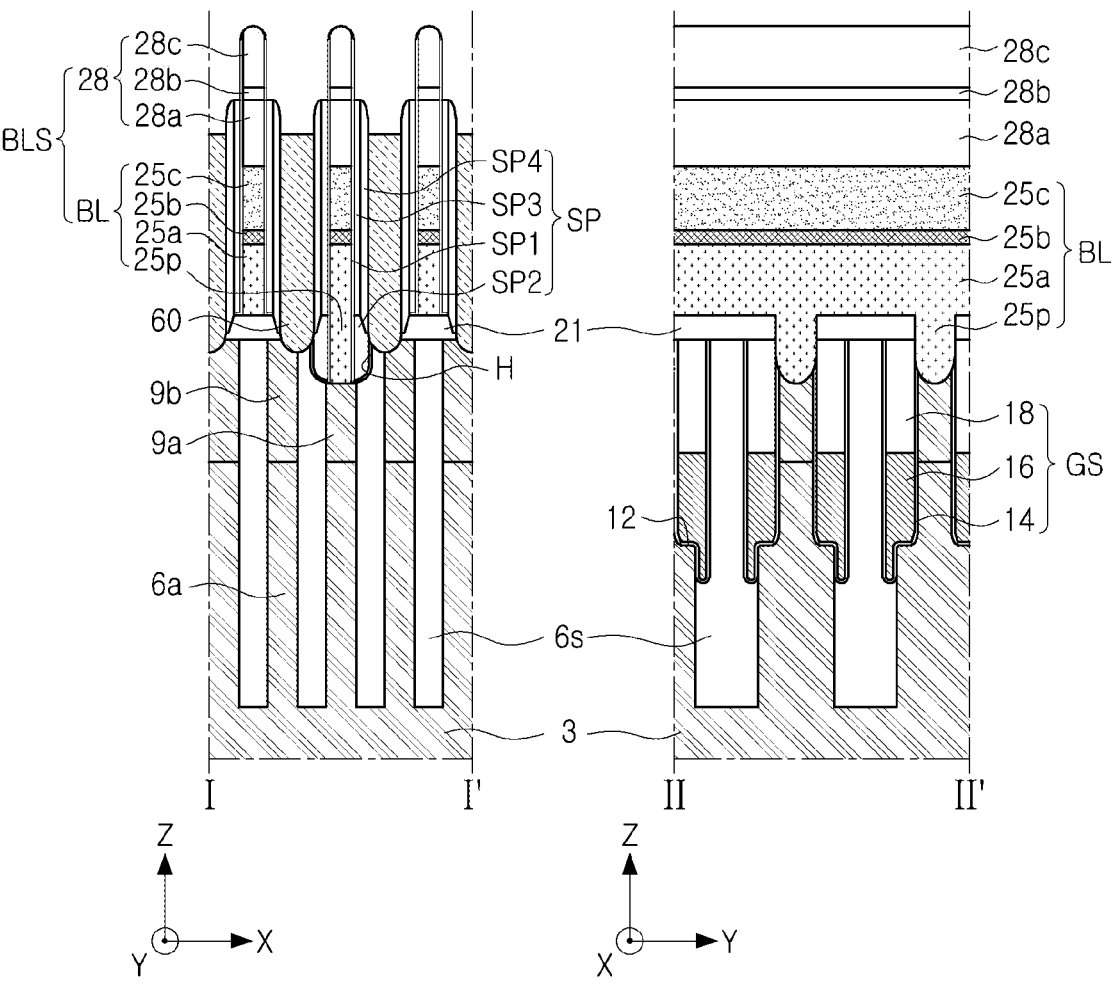

Referring to FIG. 7, the contact plug 60 may be formed in the trench T. The contact plug 60 may be formed by filling the trench T with a conductive material to cover the spacer structure SP and etching back the conductive material. An upper surface of the contact plug 60 may be located at a level lower than an upper end of the bit line structure BLS. The contact plug 60 may be in contact with the upper surface of the active region 6a, and may partially fill a space between the spacer structures SP. Thereafter, a portion of the spacer structure SP may be etched by an etching process. For example, an upper portion of the first spacer SP1, an upper portion of the third spacer SP3, and an upper portion of the fourth spacer SP4 may be partially removed. The contact plug 60 may be electrically connected to the active region 6a, e.g., the impurity regions 9b.

In an embodiment, the contact plug 60 may include doped polysilicon. For example, the contact plug 60 may be formed by depositing polysilicon together with N-type impurities in the trench. The contact plug 60 may include at least one of, e.g., a phosphorus (P) element, an arsenic (As) element, or an antimony (Sb) element.

In an embodiment, the fence structure 63, as illustrated in FIG. 1, may be formed after the contact plug 60 is formed. The fence structure 63 may be formed by removing a portion of the contact plug 60 and then filling a space from which the portion of the contact plug 60 is removed with an insulating material. Fence structures may be formed to overlap the gate structure GS between the bit line structures BLS in a vertical direction. The fence structures may be spaced apart from each other in the X-direction and Y-direction. For example, contact plugs 60 may be alternately disposed with the fence structures 63 in the Y-direction between the bit line structures BLS. In some embodiments, a process of forming the fence structure 63 may be performed prior to a process of forming the contact plug 60.

Figure 8:
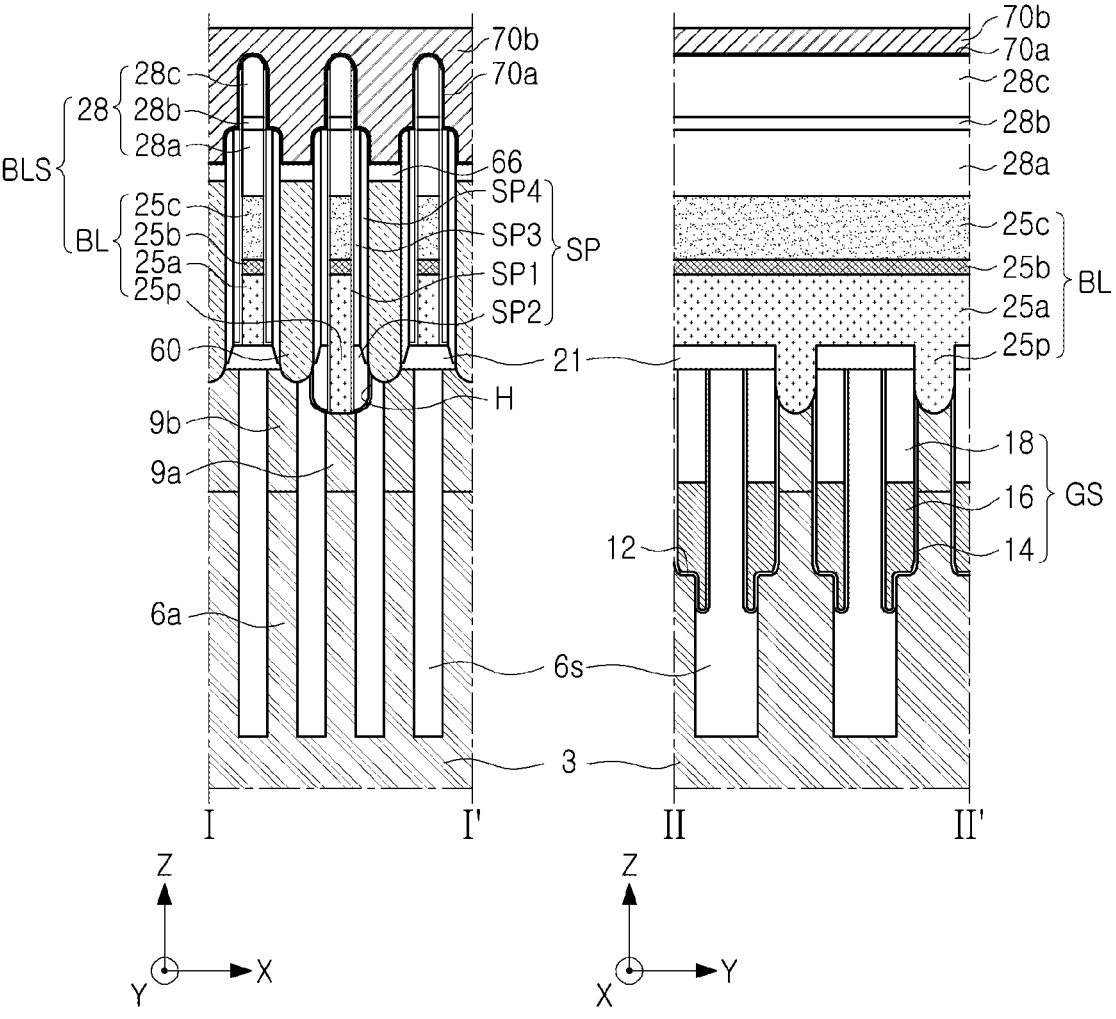

Referring to FIG. 8, a barrier layer 70a and a metal layer 70b may be formed on the resultant structure of FIG. 7. The barrier layer 70a may extend, e.g., continuously and conformally, along a surface of the bit line structure BLS and a surface of the spacer structure SP, and the metal layer 70b may cover the barrier layer 70a, e.g., and completely fill spaces between the bit line structure BLS. In an embodiment, the metal layer 70b may be formed by a deposition process, e.g., a chemical vaporization deposition (CVD) method, an atomic layer deposition (ALD) method, or the like.

In an embodiment, the metal-semiconductor compound layer 66 may be formed between the contact plug 60 and the barrier layer 70a, and the barrier layer 70a may be extended along an upper surface of the metal-semiconductor compound layer 66. The metal-semiconductor compound layer 66 may be formed by silicidizing a portion of the contact plug 60.

Figure 9:
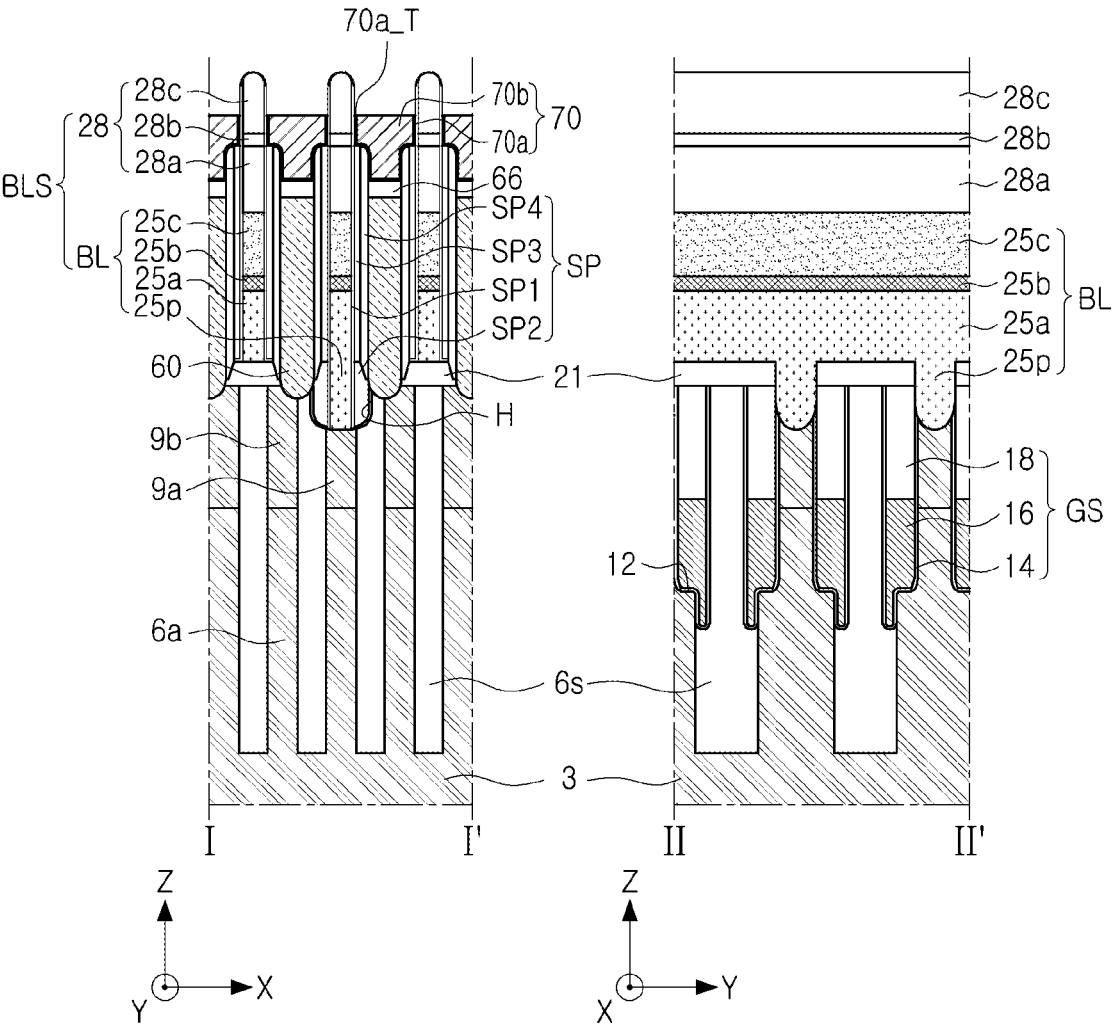

Referring to FIG. 9, a portion of the barrier layer 70a and a portion of the metal layer 70b may be removed. For example, an etch-back process may be performed, and an upper portion of the barrier layer 70a and an upper portion of the metal layer 70b may be removed to partially expose the bit line structure BLS and the spacer structure SP. The barrier layer 70a and the metal layer 70b, etched-back, may form the lower landing pad 70. Lower landing pads 70 may be spatially separated from each other, and may be electrically insulated from each other by bit line structures BLS. For example, the upper end 70a T of the barrier layer 70a may be coplanar with an upper surface of the metal layer 70b. In some embodiments, the upper end 70a_T of the barrier layer 70a may be located at a level higher or lower than the upper surface of the metal layer 70b.

Figure 10:
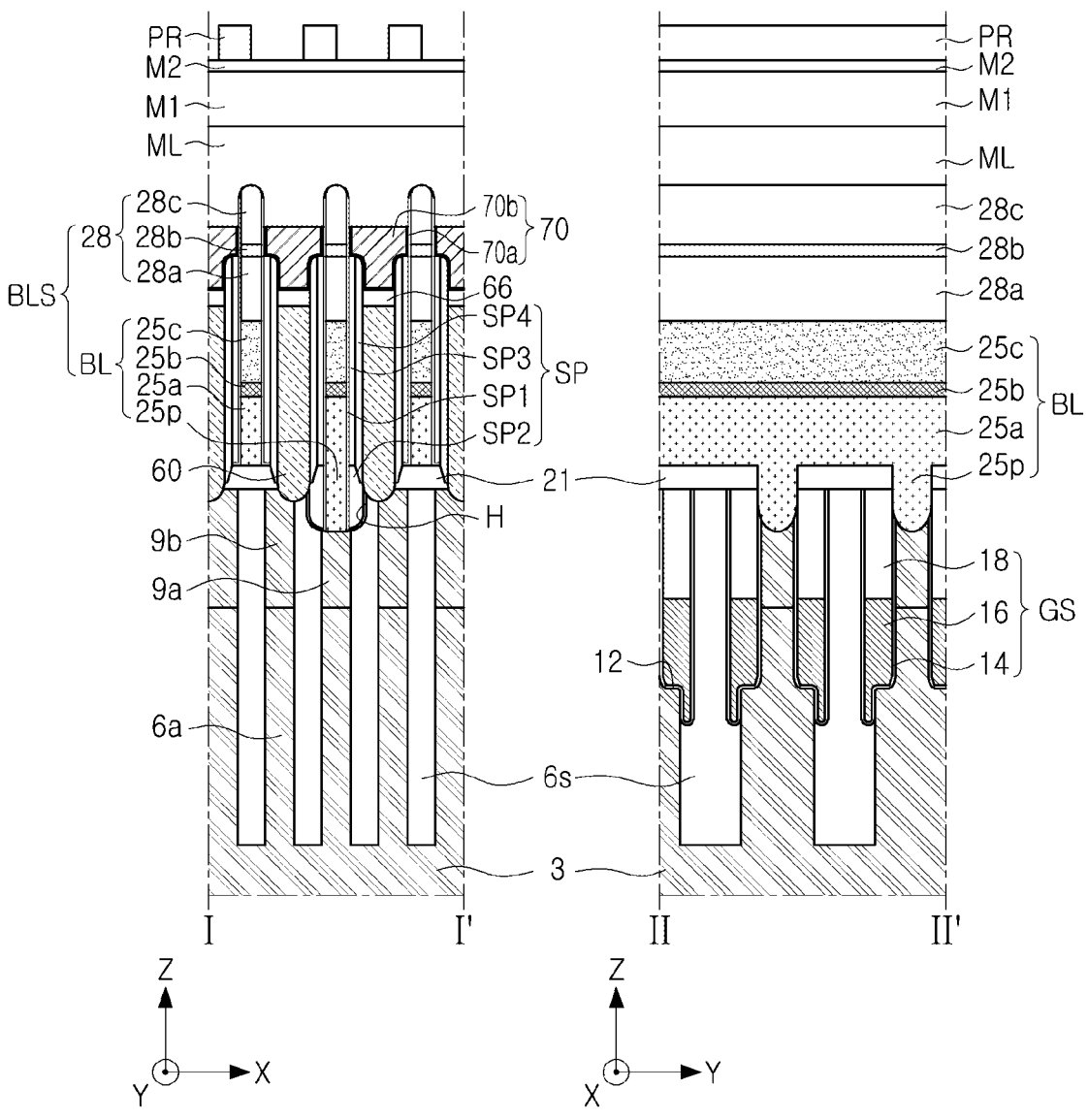

Referring to FIG. 10, a mold layer ML, a first mask layer M1, a second mask layer M2, and a photoresist PR may be sequentially stacked. The mold layer ML may cover the bit line structure BLS, the spacer structure SP, and the metal layer 70b. The photoresist PR may be patterned by an exposure process and a development process, and a portion of the second mask layer M2 corresponding to the insulating pattern 72, as illustrated in FIG. 2, may be exposed.

The mold layer ML may include, e.g., silicon oxide, silicon nitride, silicon oxynitride, or a combination thereof. In an embodiment, the mold layer ML may include a material identical to a material of the insulating pattern 72, as illustrated in FIG. 2, and may include, e.g., silicon nitride. The first mask layer M1 may include a material having etch selectivity with regard to the mold layer ML, and may include, e.g., an amorphous carbon layer (ACL). The second mask layer M2 may include a material having etch selectivity with regard to the first mask layer M1, and may include, e.g., silicon oxynitride (SiON).

Figure 11:
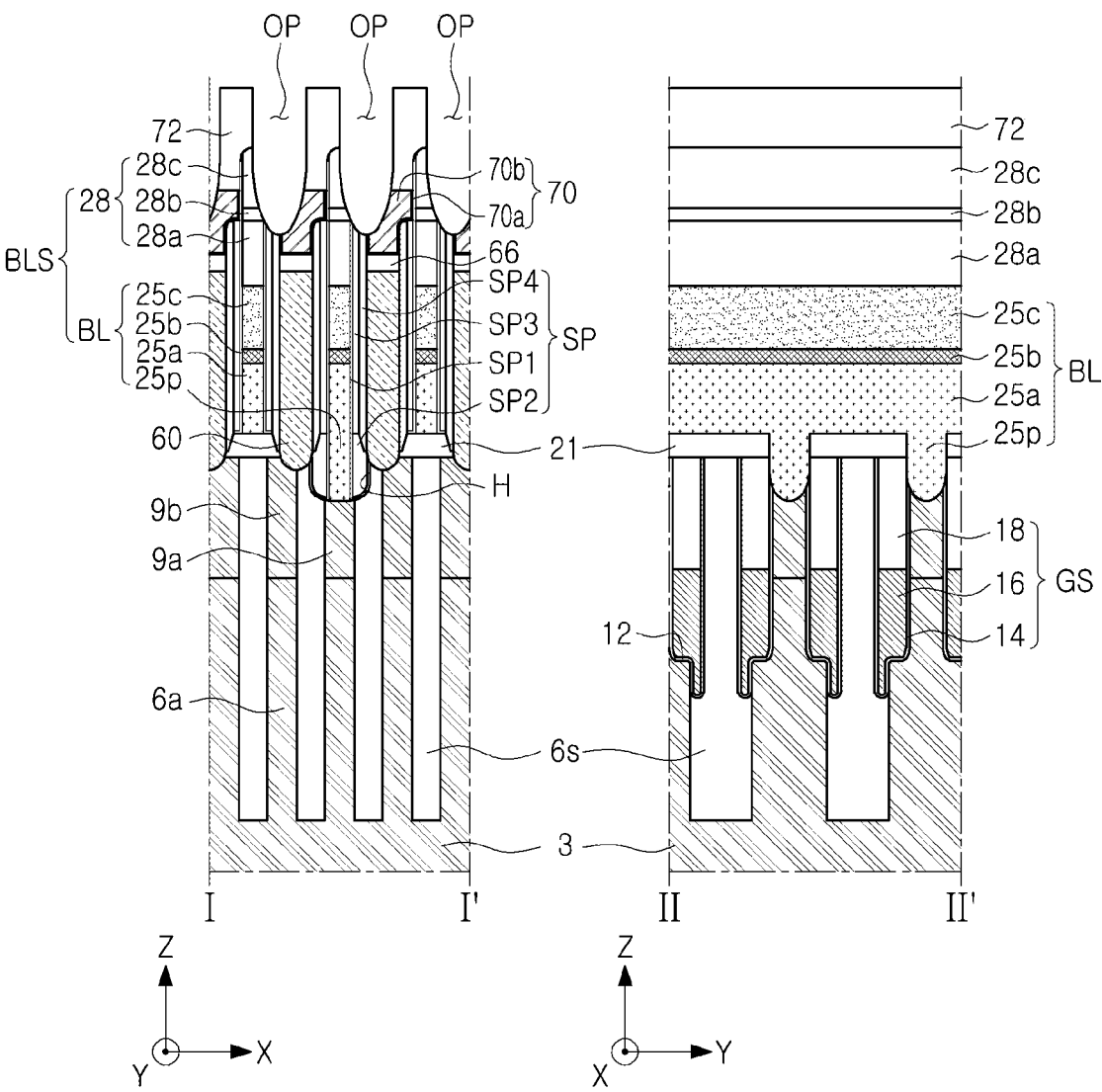

Referring to FIG. 11, the first mask layer M1 and the second mask layer M2 may be patterned by an etching process using the photoresist PR as an etching mask. Thereafter, the mold layer ML may be patterned by an etching process using the first mask layer M1 and the second mask layer M2 as etching masks, to form an opening OP. At least a portion of the bit line structure BLS, the spacer structure SP, or the lower landing pad 70 may be exposed through the opening OP. The patterned mold layer ML may be referred to as the insulating pattern 72.

Figure 12:
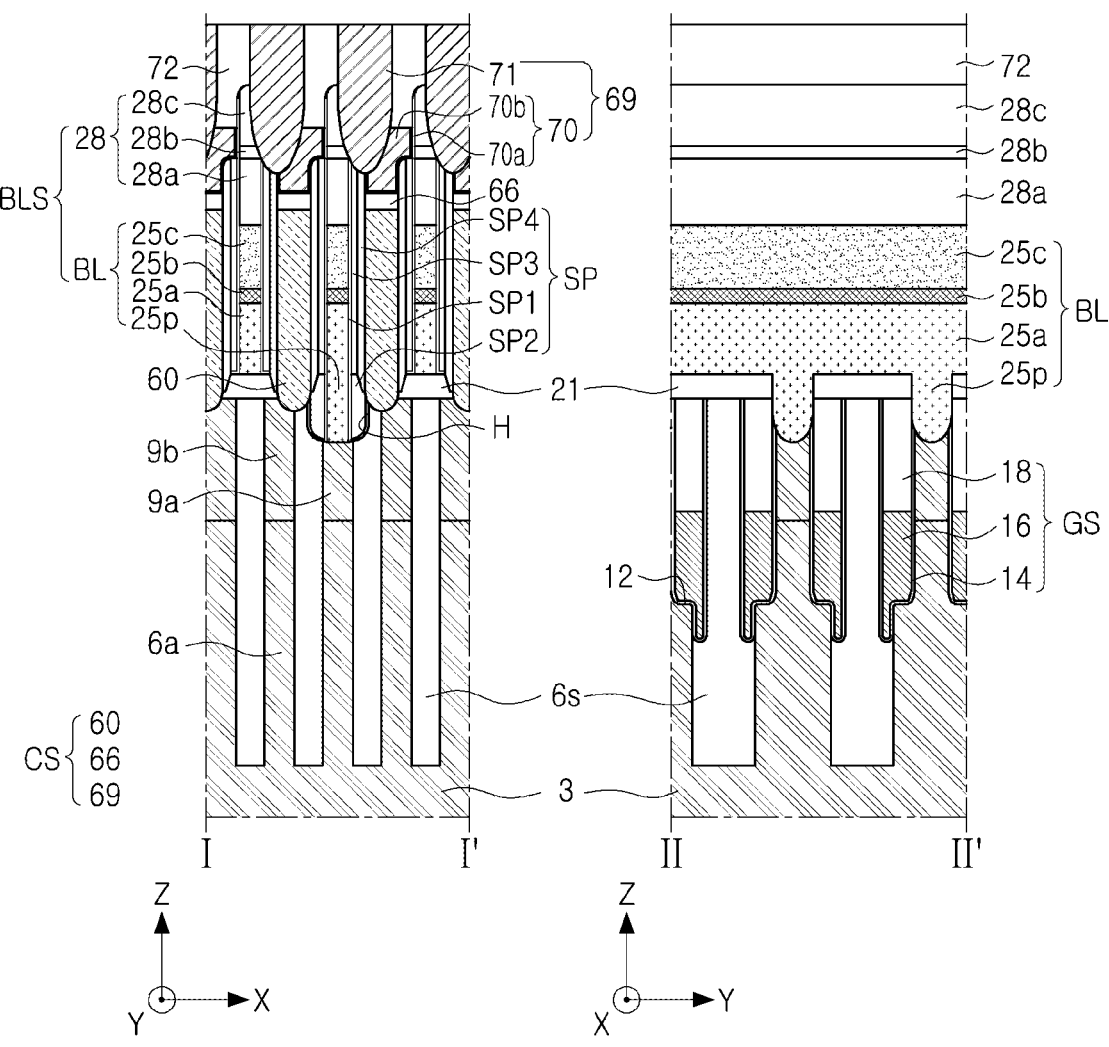

Referring to FIG. 12, an upper landing pad 71 may be formed in the opening OP. The upper landing pad 71 may be prepared by forming a conductive material to fill the opening OP and cover an upper surface of the insulating pattern 72, and then etching the conductive material. The etching the conductive material may include at least one of a process of etching back the conductive material and a process of planarizing the conductive material and the insulating pattern 72. An upper surface of the upper landing pad 71 may be coplanar with the upper surface of the insulating pattern 72. Upper landing pads 71 may be spatially separated from each other by insulating patterns 72, and may be electrically insulated from each other.

In an embodiment, forming the upper landing pad 71 may include growing the conductive material from the metal layer 70b of the lower landing pad 70. For example, a precursor gas containing metal atoms and a reaction gas may be provided in the opening, and a conductive material may be formed by reacting the precursor gas and the reaction gas. The precursor gas may not be deposited on a surface of the spacer structure SP, a surface of the bit line capping layer 28, and a surface of the insulating pattern 72, including an insulating material, and may be deposited only on a surface of the lower landing pad 70 including a metal material. For example, the precursor gas may be selectively deposited only on a surface of the metal layer 70b. A process of growing the conductive material may be performed by an atomic layer deposition (ALD) method. Therefore, a conductive material may grow from the metal layer 70b of the lower landing pad 70 to form the upper landing pad 71. The upper landing pad 71 may include a material, identical to a material of the metal layer 70b of the lower landing pad 70, and may include, e.g., at least one of titanium (Ti), tantalum (Ta), tungsten (W), molybdenum (Mo), or aluminum (Al). The lower landing pad 70 and the upper landing pad 71 may constitute a landing pad structure 69. The contact plug 60, the metal-semiconductor compound layer 66, and the landing pad structure 69 may constitute the contact structure CS.

In general, in an etching process, notching may occur when a conductive material is excessively etched, and bridging may occur when the conductive material is not sufficiently etched. As illustrated in FIG. 12, the upper landing pad 71 of the landing pad structure 69 may not be formed by etching a conductive material, but may be formed by growing a conductive material from the metal layer 70b. Therefore, since occurrence of device defects, e.g., notching and bridging, may be prevented, and the landing pad structure 69 may be formed in smaller design rules, the semiconductor device 100 may be implemented to have a smaller size.

Referring back to FIG. 2, the semiconductor device 100 may be manufactured by forming the etch stop layer 75 and the capacitor structure 80 on the landing pad structure 69 and the insulating pattern 72. The etch stop layer 75 may be formed to cover an upper surface of the landing pad structure 69 and an upper surface of the insulating pattern 72. The capacitor structure 80 may include the lower electrode 82 connected to the landing pad structure 69 through the etch stop layer 75, the capacitor dielectric layer 84 on the lower electrode 82, and the upper electrode 86 on the capacitor dielectric layer 84.

FIGS. 13 to 16 are vertical cross-sectional views in a process sequence illustrating stages in a method of manufacturing a semiconductor device according to an example embodiment.

In an embodiment, in the process described with reference to FIG. 10, a sacrificial layer SL may be used, instead of the mold layer ML. The sacrificial layer SL may include silicon oxide.

Figure 13:
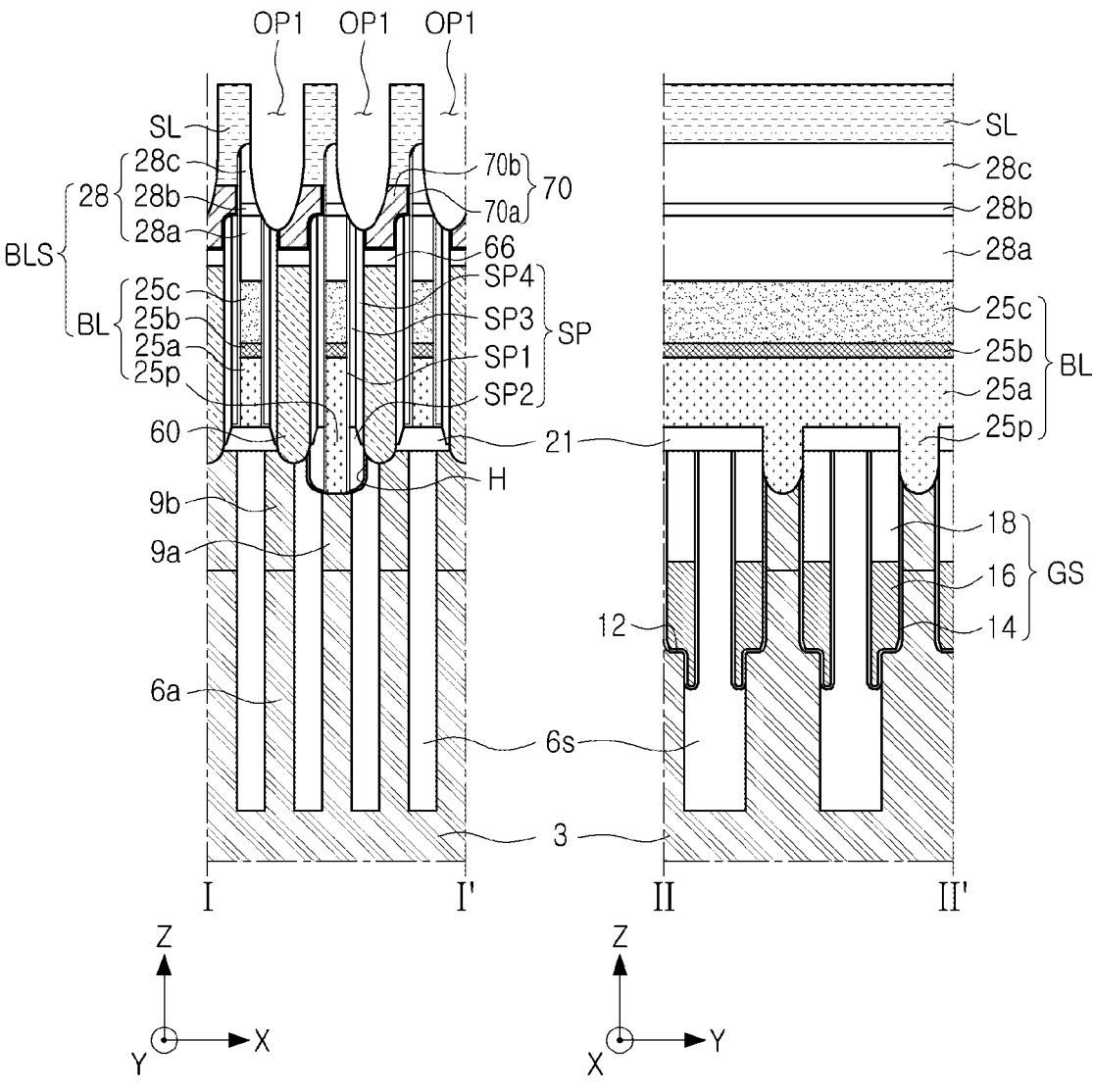
FIGS. 13 to 16 are vertical cross-sectional views of stages in a method of manufacturing a semiconductor device according to an example embodiment.

Referring to FIG. 13, the first mask layer M1 and the second mask layer M2 may be patterned by an etching process using the photoresist PR. Thereafter, the sacrificial layer SL may be patterned by an etching process using the first mask layer M1 and the second mask layer M2, to form a first opening OP1. At least a portion of the bit line structure BLS, the spacer structure SP, and the lower landing pad 70 may be exposed through the first opening OP1.

Figure 14:
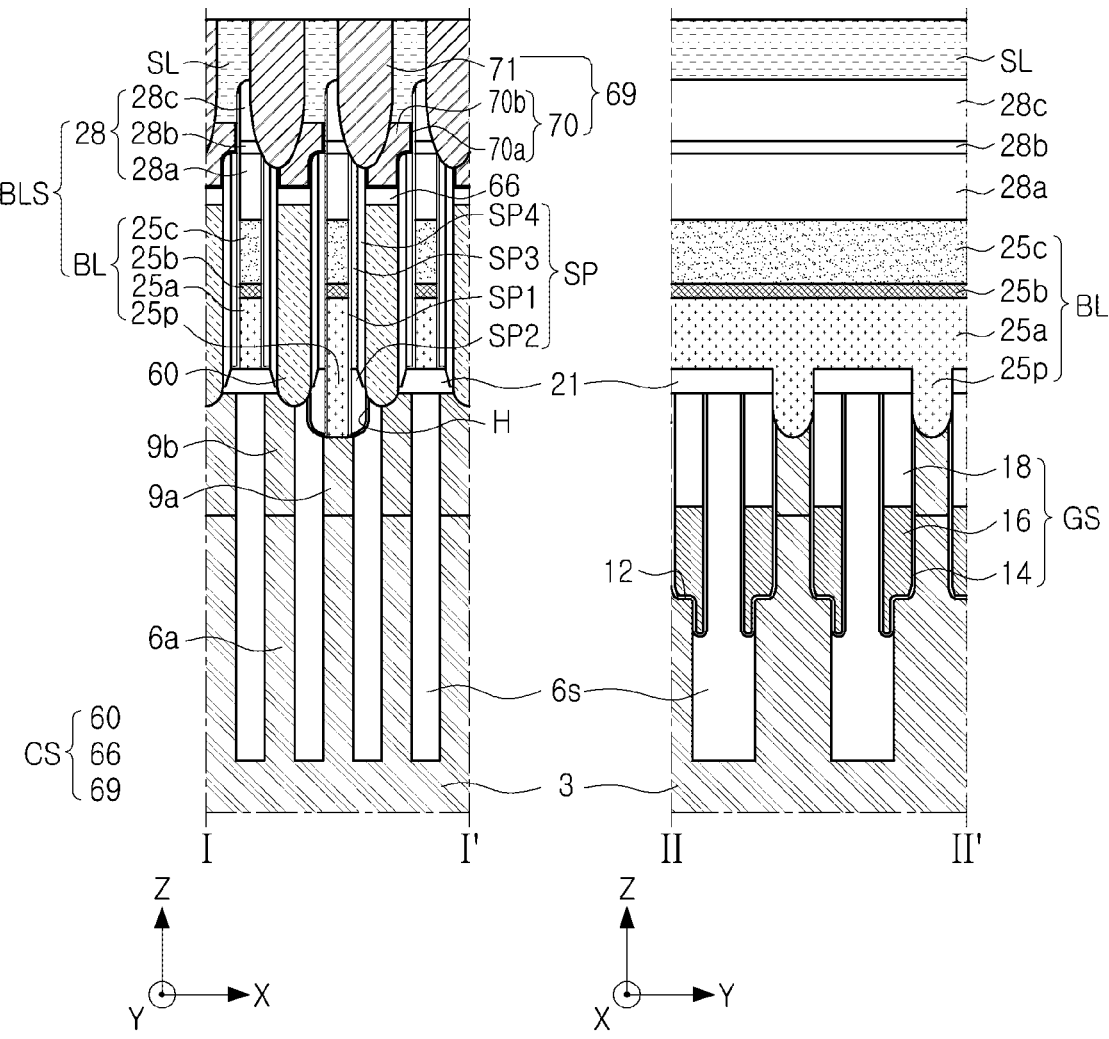

Referring to FIG. 14, the upper landing pad 71 may be formed in the first opening OP1. The upper landing pad 71 may be prepared by forming a conductive material to fill the first opening OP1 and cover an upper surface of the sacrificial layer SL, and then etching the conductive material. In an embodiment, the upper landing pad 71 may be formed by growing a conductive material from the metal layer 70b of the lower landing pad 70.

Figure 15:
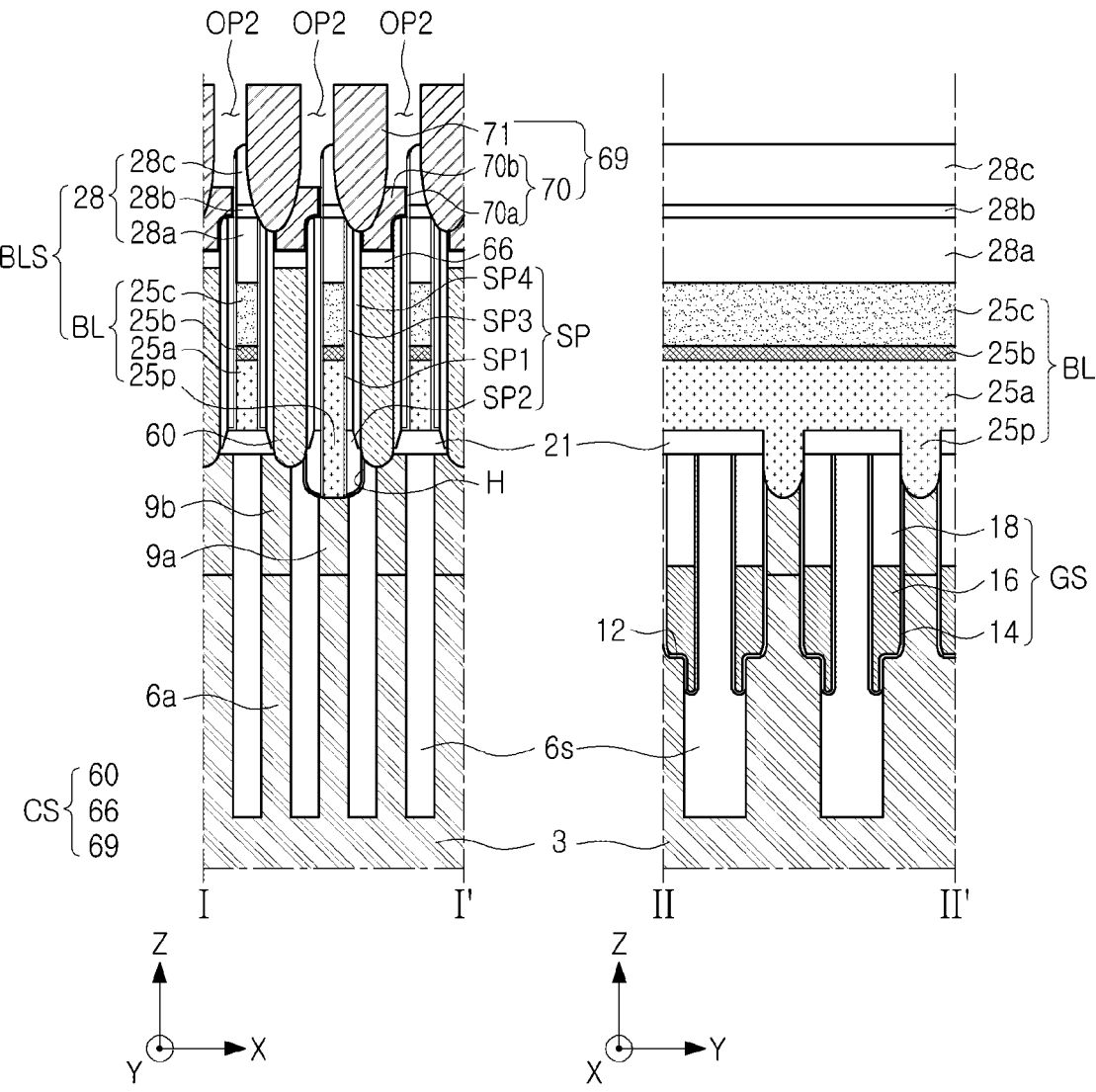

Referring to FIG. 15, the sacrificial layer SL may be removed to form a second opening OP2. At least a portion of an upper surface of the bit line structure BLS, an upper surface of the spacer structure SP, an upper surface of the lower landing pad 70, and a side surface of the upper landing pad 71 may be exposed through the second opening OP2.

Figure 16:
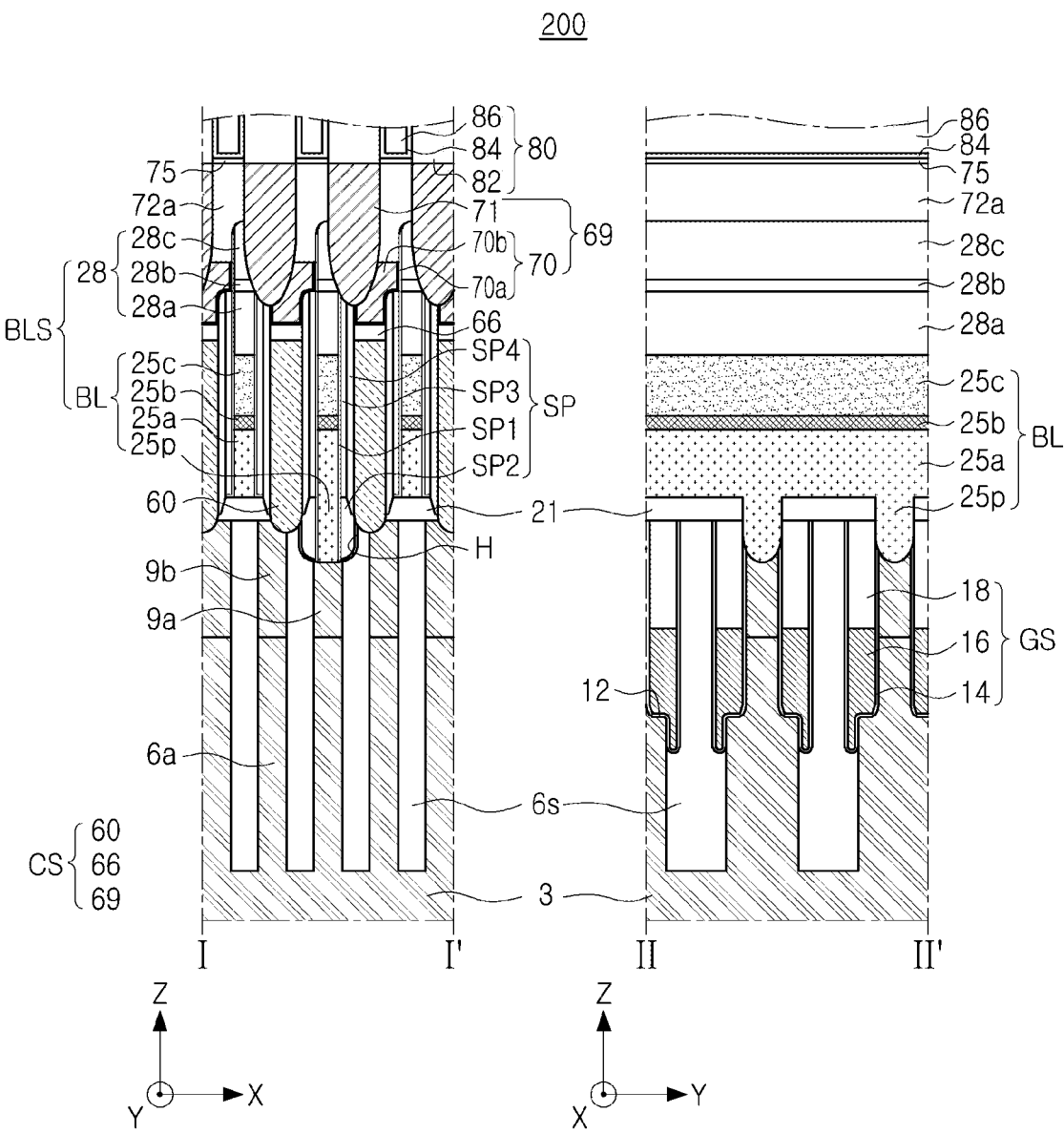

Referring to FIG. 16, an insulating pattern 72a may be formed in the second opening OP2. The insulating pattern 72a may be formed by depositing an insulating material to fill the second opening OP2 and cover the upper landing pad 71, and planarizing the insulating material and the upper landing pad 71. The insulating pattern 72a may include a material identical to a material of the insulating pattern 72, e.g., silicon nitride. Thereafter, the etch stop layer 75 and the capacitor structure 80 may be formed on the landing pad structure 69 and the insulating pattern 72a to manufacture a semiconductor device 200.

Figure 17:
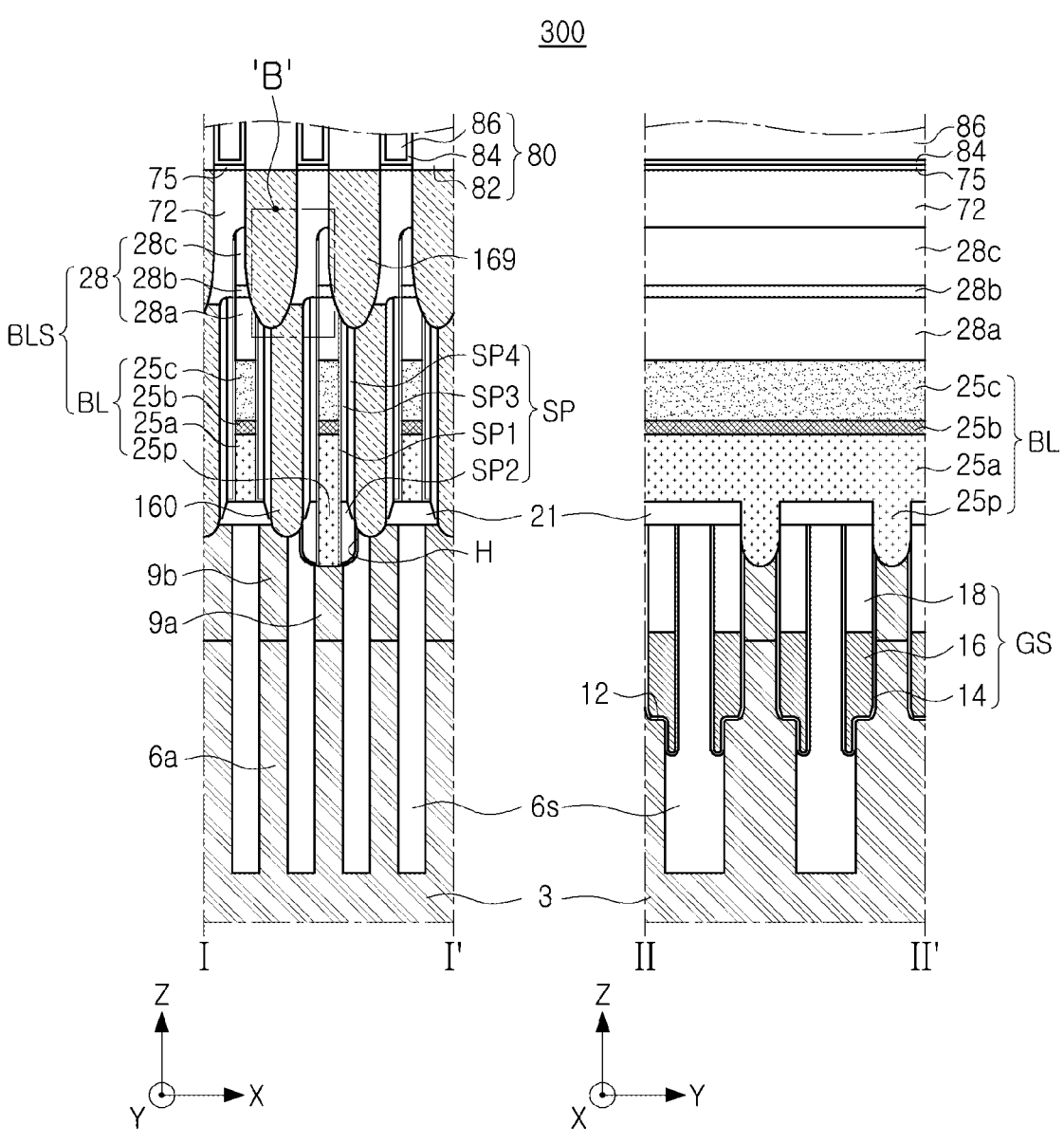
FIG. 17 illustrates vertical cross-sectional views of a semiconductor device according to an example embodiment.
Figure 18:
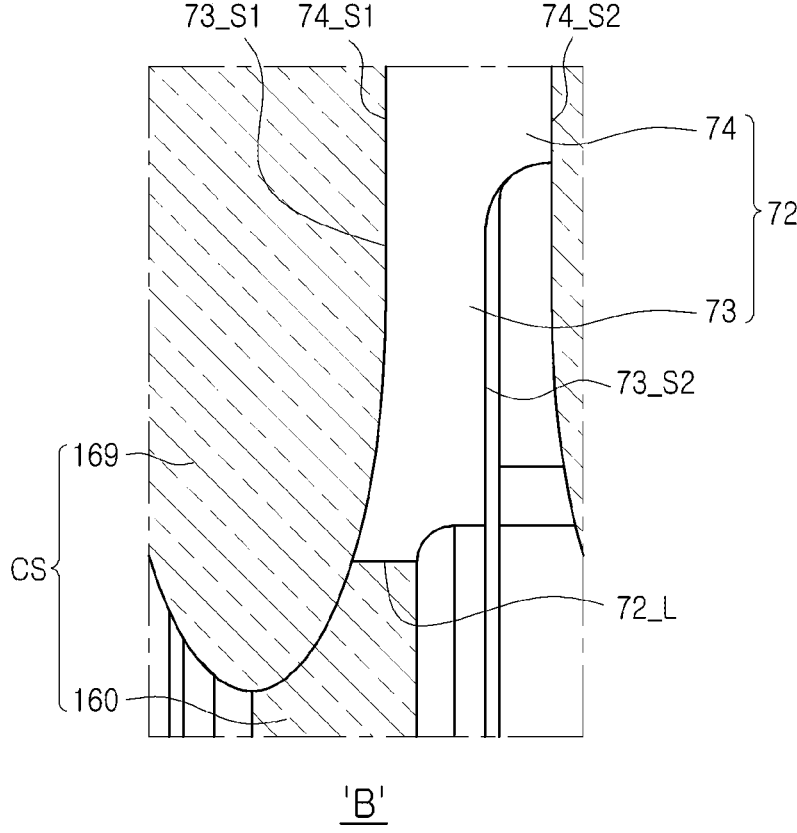
FIG. 18 is a partially enlarged view of the semiconductor device of FIG. 17.

FIG. 17 illustrates vertical cross-sectional views of a semiconductor device according to an example embodiment. FIG. 18 is a partially enlarged view of the semiconductor device of FIG. 17. FIG. 18 may correspond to portion B of FIG. 17.

Referring to FIGS. 17 and 18, a semiconductor device 300 may include contact structures CS disposed between the bit line structures BLS, and the insulating patterns 72 disposed between the contact structures CS. In an embodiment, each of the contact structures CS may include the contact plug 160 and a landing pad structure 169 on the contact plug 160. The contact plug 160 may have the same or similar structure and material, as compared to the contact plug 60 illustrated in FIG. 2.

In an embodiment, the landing pad structure 169 may include a material identical to a material of the contact plug 160, and may be integrally coupled to the contact plug 160. For example, the landing pad structure 169 may include polysilicon. The metal-semiconductor compound layer 66, as illustrated in FIG. 2, may not be disposed between the landing pad structure 169 and the contact plug 160.

The insulating pattern 72 may include the first portion 73 and the second portion 74 on the first portion 73. Since the insulating pattern 72 may have the same or similar structure, as compared to the insulating pattern 72 illustrated in FIG. 3, a detailed description thereof may be omitted. A lower surface 72_L of the insulating pattern 72 may be in direct contact with an upper surface of the contact plug 160. A lower surface of the first portion 73 may include a flat surface. In an embodiment, a side surface of the insulating pattern 72 may include a concave curved surface toward the landing pad structure 169. For example, the first side surface 73_S1 of the first portion 73 and the first side surface 74_S1 of the second portion 74 may include a concave curved surface toward an upper landing pad 71, respectively. The second side surface 73_S2 of the first portion 73 may include a concave curved surface toward the bit line structures BLS and a spacer structure SP, and the second side surface 74_S2 of the second portion 74 may include a concave curved surface toward the landing pad structure 169.

FIGS. 19 to 22 are vertical cross-sectional views in a process sequence illustrating stages in a method of manufacturing a semiconductor device 300 according to an example embodiment.

Figure 19:
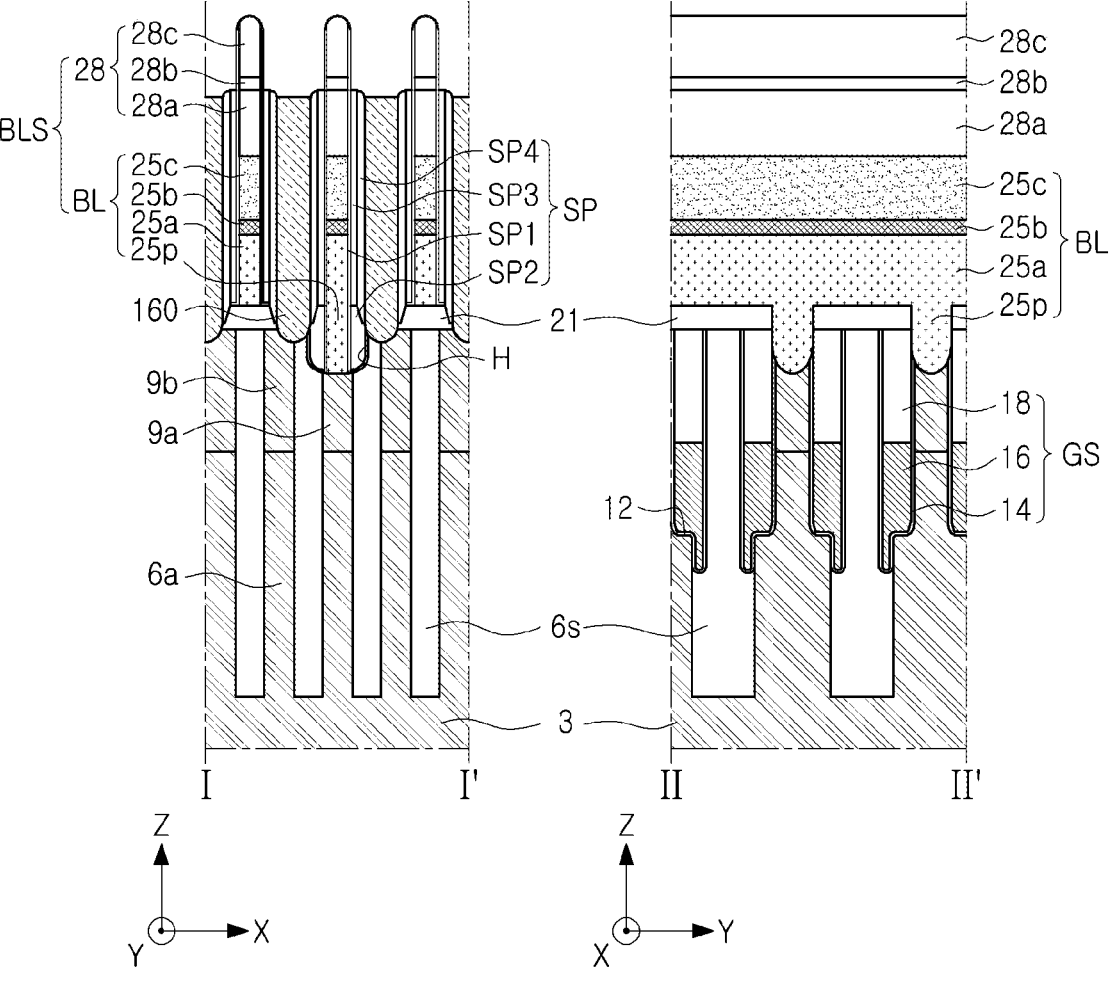
FIGS. 19 to 22 are vertical cross-sectional views of stages in a method of manufacturing a semiconductor device according to an example embodiment.

Referring to FIG. 19, the process described with reference to FIG. 7 may be performed to form the contact plug 160 between bit line structures BLS.

Figure 20:
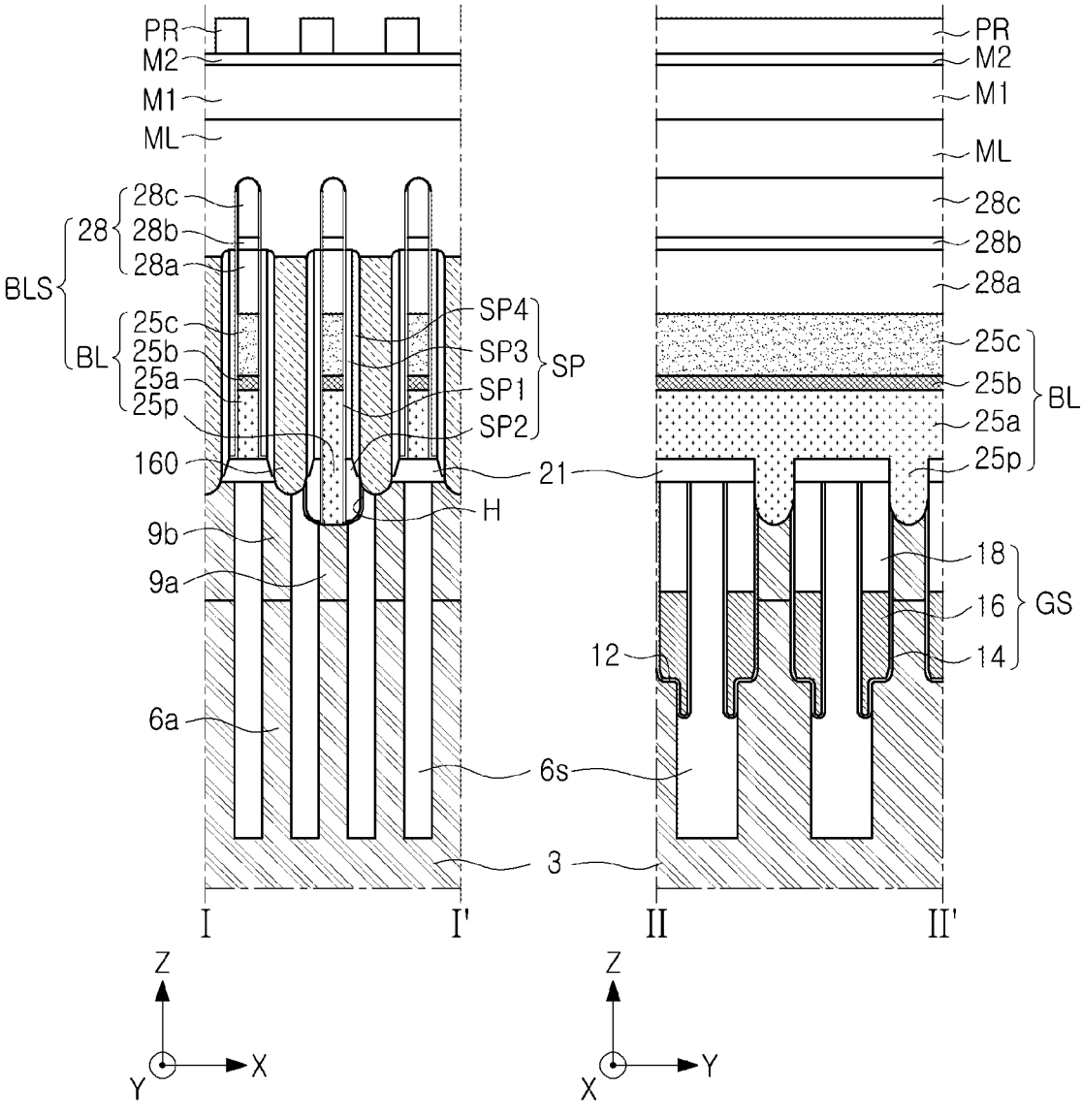

Referring to FIG. 20, the mold layer ML, the first mask layer M1, the second mask layer M2, and the photoresist PR may be sequentially stacked. The mold layer ML may cover each of the bit line structures BLS, the spacer structure SP, and the contact plug 160. The photoresist PR may be patterned in an exposure process and a development process, and a portion of the second mask layer M2 corresponding to the insulating pattern 72, as illustrated in FIG. 17, may be exposed.

Figure 21:
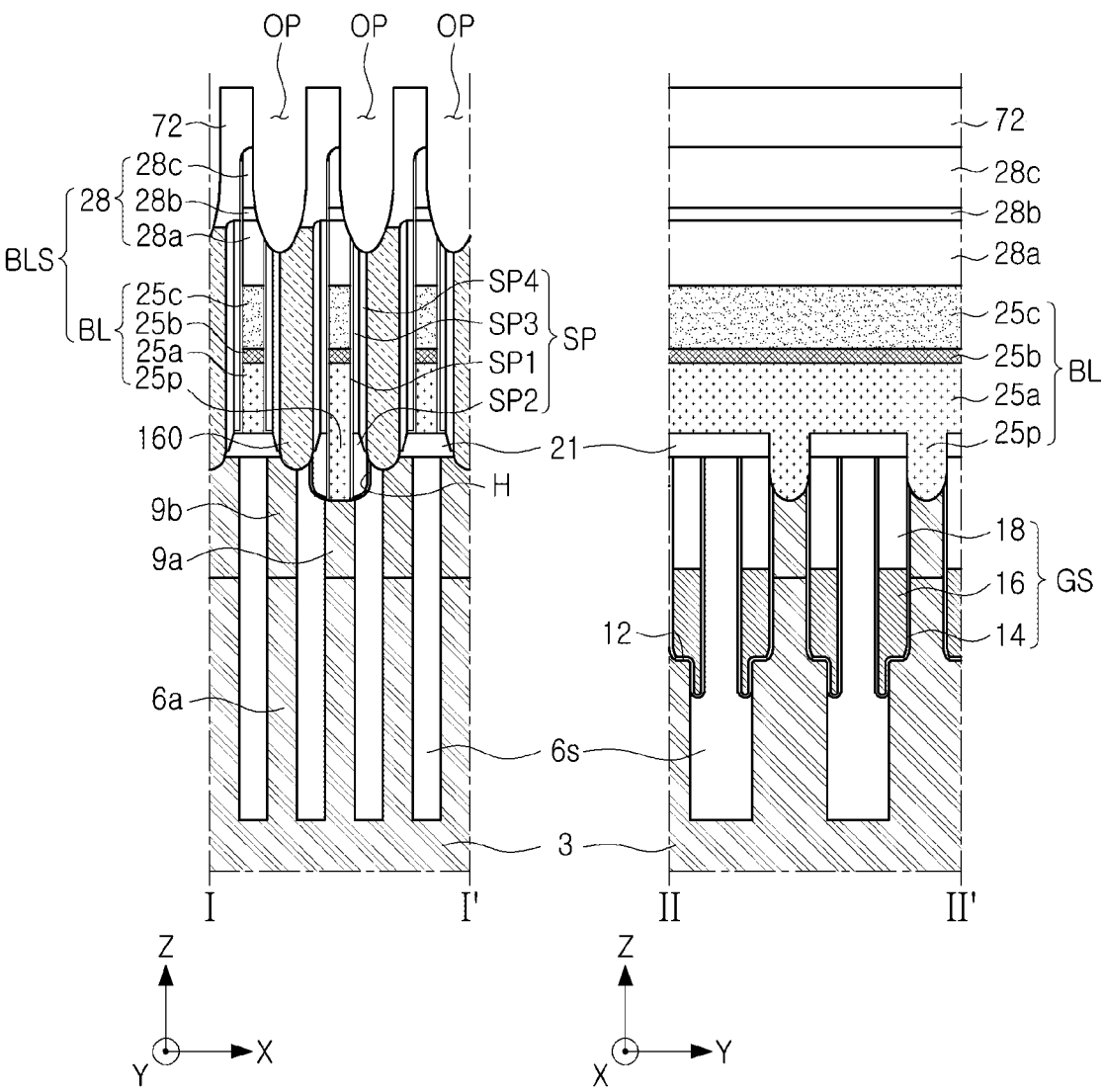

Referring to FIG. 21, the first mask layer M1 and the second mask layer M2 may be patterned by an etching process using the photoresist PR as an etching mask. Thereafter, the mold layer ML may be patterned by an etching process using the first mask layer M1 and the second mask layer M2 as etching masks, to form an opening OP. At least a portion of each of the bit line structures BLS, the spacer structure SP, and the lower landing pad 70 may be exposed through the opening OP. The patterned mold layer ML may be referred to as the insulating pattern 72.

Figure 22:
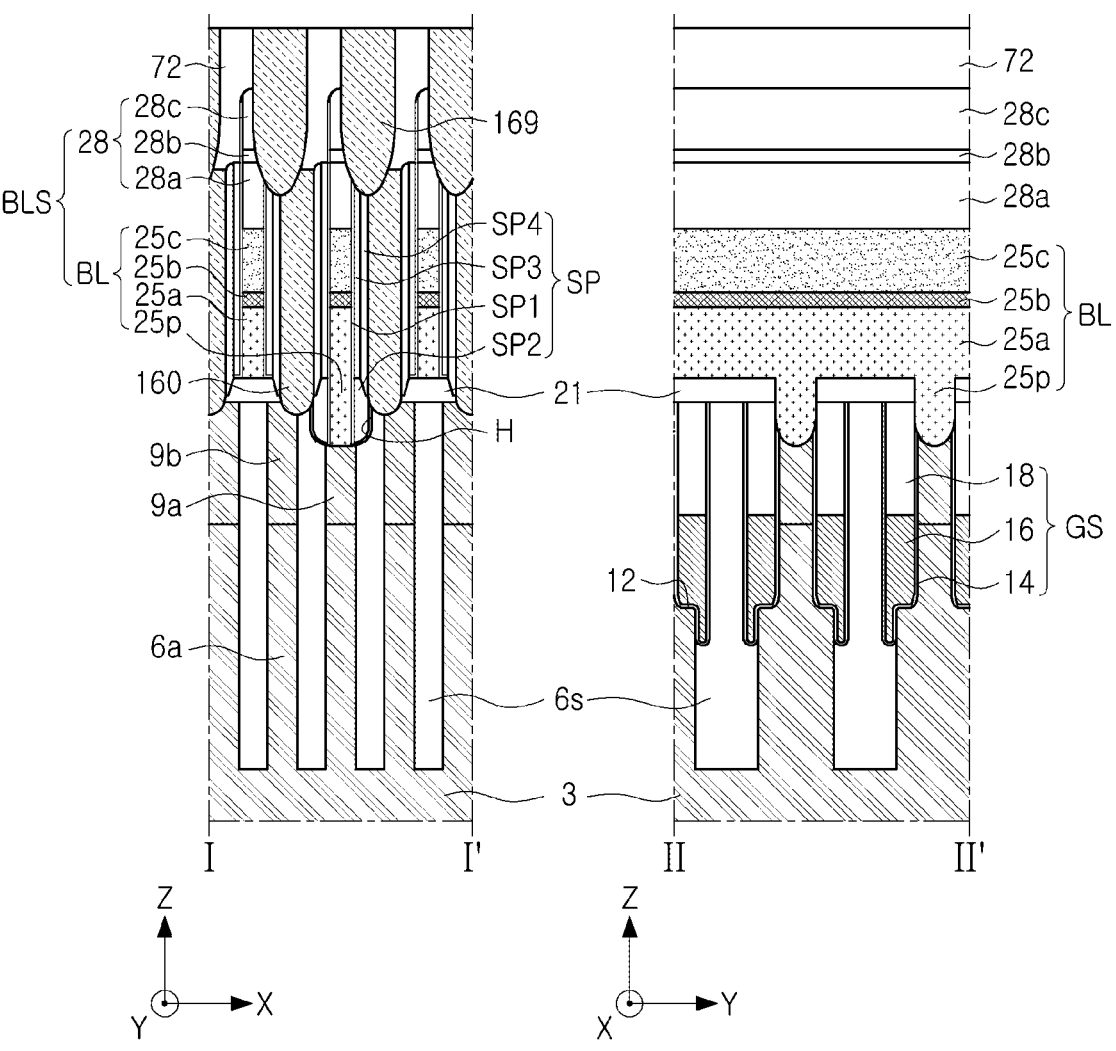

Referring to FIG. 22, the landing pad structure 169 may be formed in the opening OP. The landing pad structure 169 may be prepared by forming a conductive material to fill the opening OP and cover an upper surface of the insulating pattern 72, and then etching the conductive material. The etching the conductive material may include at least one of a process of etching back the conductive material and a process of planarizing the conductive material and the insulating pattern 72.

In an embodiment, forming the landing pad structure 169 may include growing polysilicon from the contact plug 160 or depositing polysilicon on the contact plug 160.

Referring back to FIG. 17, the semiconductor device 300 may be manufactured by forming the etch stop layer 75 and the capacitor structure 80 on the landing pad structure 169 and the insulating pattern 72.

FIGS. 23 to 26 are vertical cross-sectional views in a process sequence illustrating stages in a method of manufacturing a semiconductor device according to an example embodiment.

In an embodiment, in the process described with reference to FIG. 20, a sacrificial layer SL may be used, instead of the mold layer ML. The sacrificial layer SL may include silicon oxide.

Figure 23:
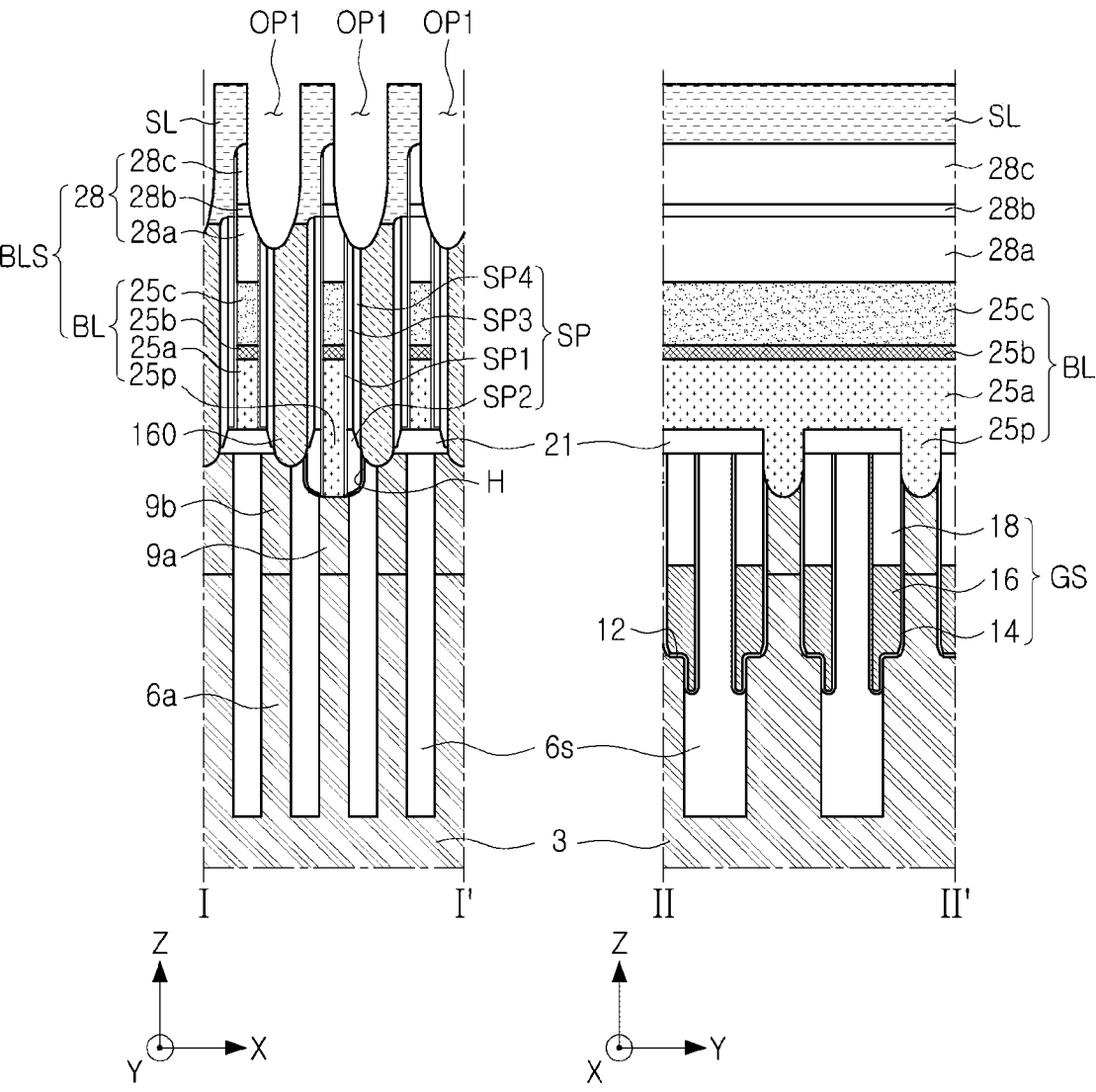
FIGS. 23 to 26 are vertical cross-sectional views of stages in a method of manufacturing a semiconductor device according to an example embodiment.

Referring to FIG. 23, the first mask layer M1 and the second mask layer M2 may be patterned by an etching process using the photoresist PR. Thereafter, the sacrificial layer SL may be patterned by an etching process using the first mask layer M1 and the second mask layer M2, to form the first opening OP1.

Figure 24:
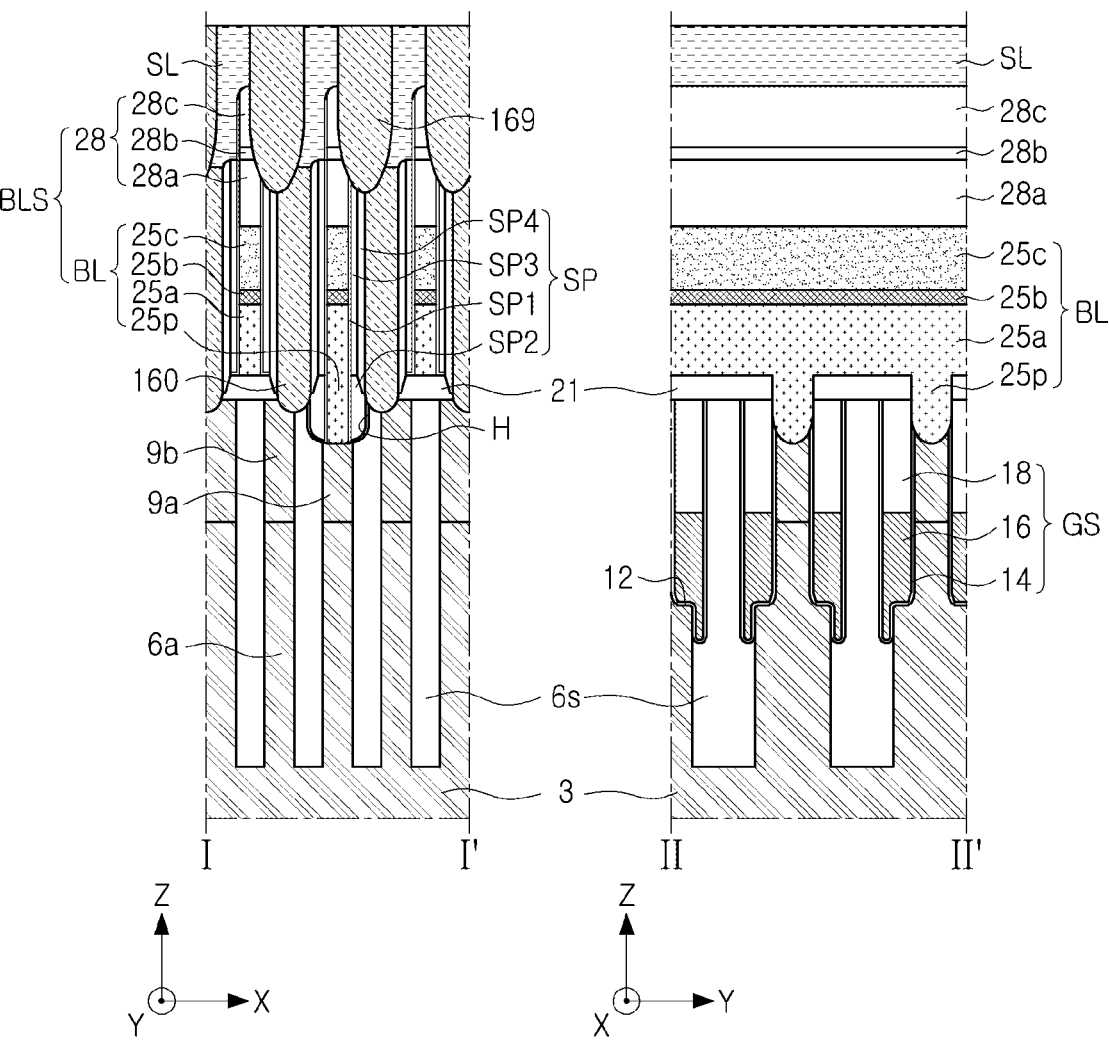

Referring to FIG. 24, the landing pad structure 169 may be formed in the first opening OP1. The landing pad structure 169 may be prepared by forming a conductive material to fill the first opening OP1 and cover an upper surface of the sacrificial layer SL, and then etching the conductive material.

Figure 25:
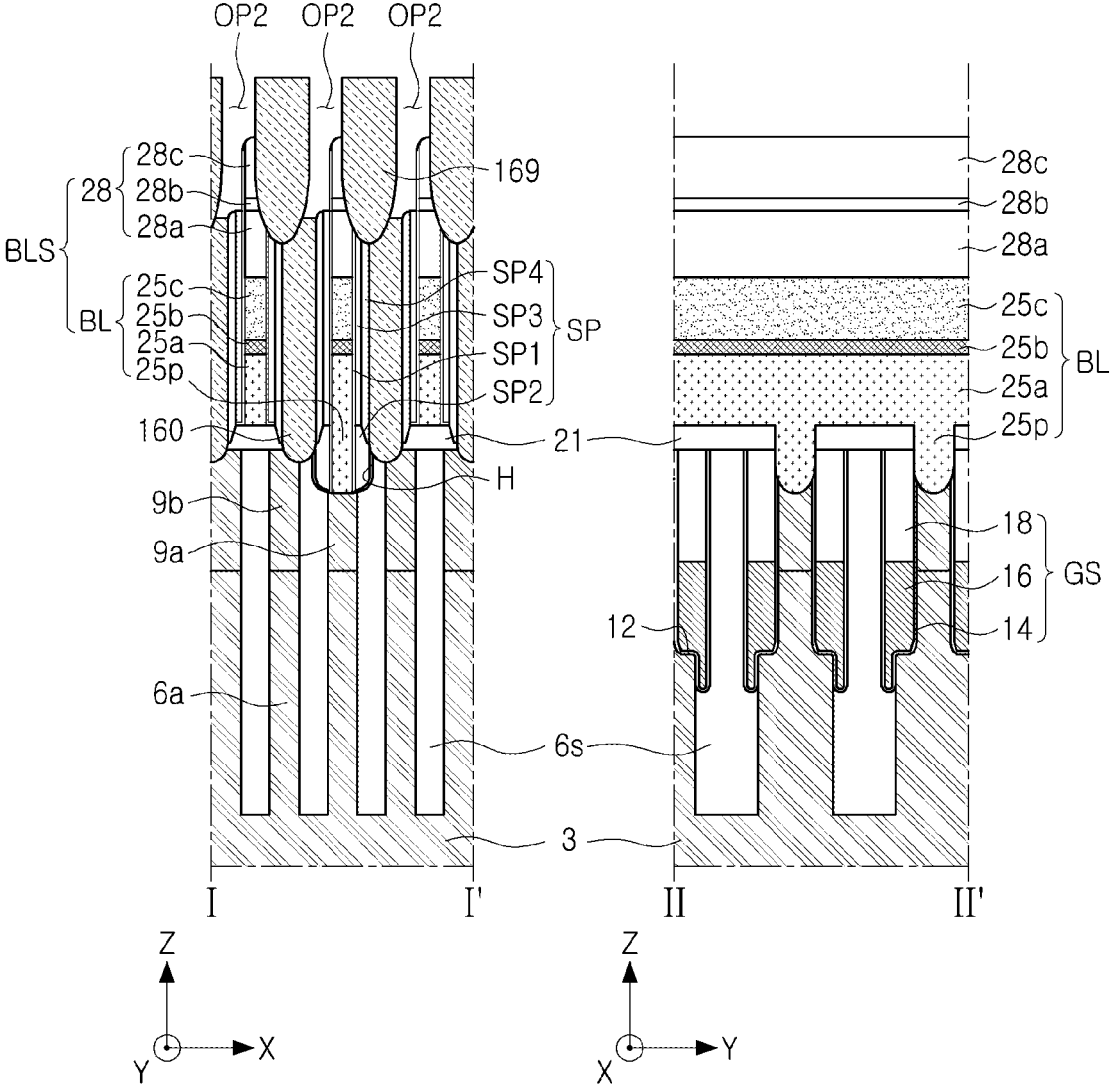

Referring to FIG. 25, the sacrificial layer SL may be removed to form a second opening OP2. At least a portion of an upper surface of a bit line structure BLS, an upper surface of a spacer structure SP, and a side surface of the landing pad structure 169 may be exposed through the second opening OP2.

Figure 26:
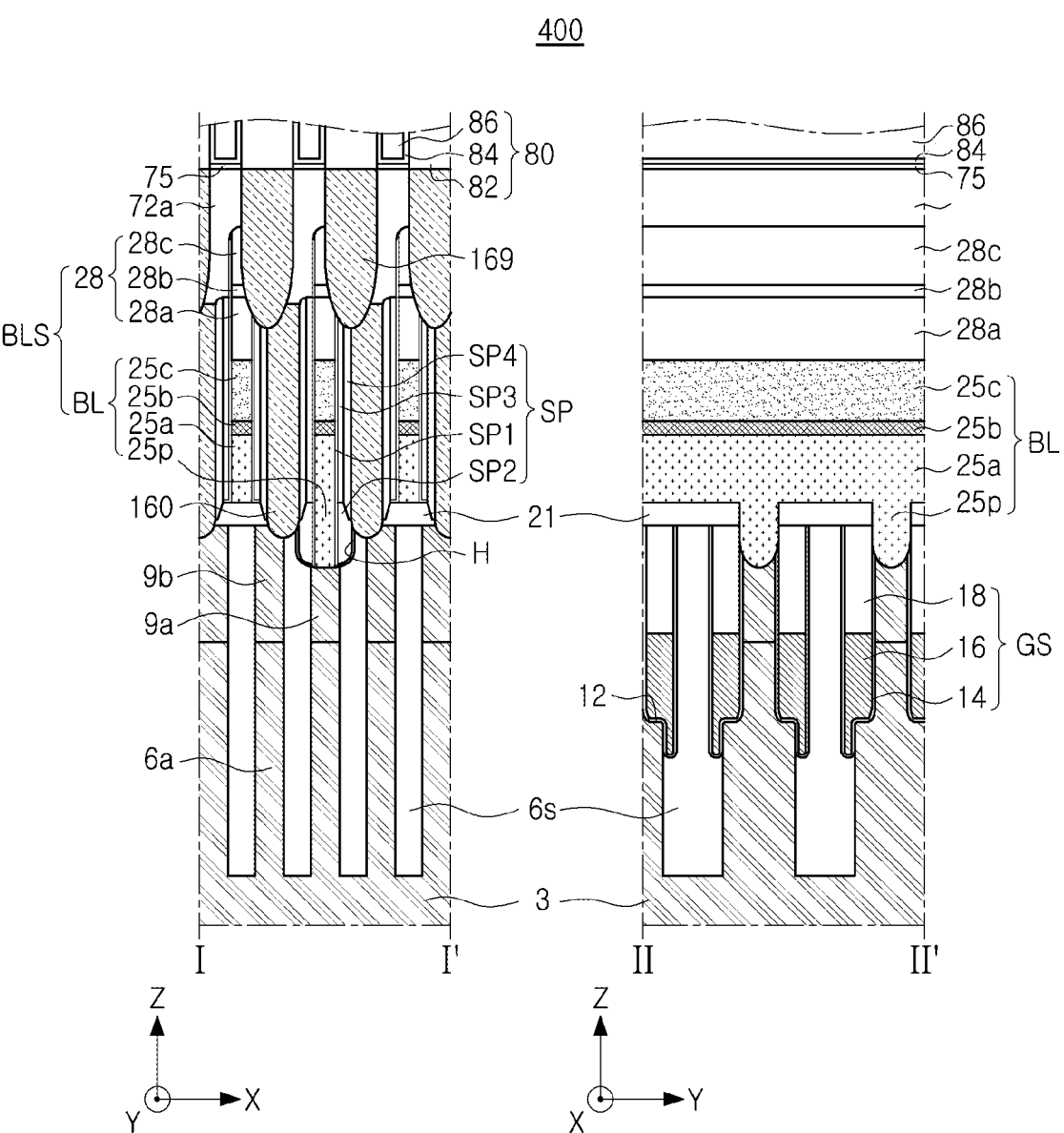

Referring to FIG. 26, an insulating pattern 72a may be formed in the second opening OP2. The insulating pattern 72a may be formed by depositing an insulating material to fill the second opening OP2 and cover the landing pad structure 169, and planarizing the insulating material and the landing pad structure 169. The insulating pattern 72a may include a material identical to a material of the insulating pattern 72, e.g., silicon nitride. Thereafter, the etch stop layer 75 and the capacitor structure 80 may be formed on the landing pad structure 169 and the insulating pattern 72a, to manufacture a semiconductor device 400.

By way of summation and review, embodiments provide a semiconductor device including a landing pad structure in which an upper landing pad is integrally coupled to a metal layer of a lower landing pad. Embodiments also provide a semiconductor device including a landing pad structure integrally coupled to a contact plug.

That is, according to embodiments, since a landing pad structure is formed by growing a conductive material from a metal layer (e.g., rather than etching the conductive material after deposition), occurrence of device defects may be prevented or substantially minimized. Therefore, a miniaturized semiconductor device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including an active region;
a gate structure in the substrate, the gate structure crossing the active region and extending in a first horizontal direction;
bit line structures crossing the gate structure and extending in a second horizontal direction, the second horizontal direction intersecting the first horizontal direction;
a contact plug between the bit line structures;
a landing pad structure on the contact plug and including a lower landing pad and an upper landing pad on the lower landing pad, the lower landing pad including a barrier layer and a metal layer on the barrier layer, and the upper landing pad being integrally coupled to the metal layer; and
an insulating pattern on the lower landing pad and contacting a side surface of the upper landing pad, a side surface of the insulating pattern including a concave curved surface toward an adjacent bit line structure among the bit line structures.

2. The semiconductor device as claimed in claim 1, wherein the metal layer includes a material identical to a material of the upper landing pad.

3. The semiconductor device as claimed in claim 1, wherein a lower surface of the insulating pattern is in direct contact with an upper surface of the metal layer and an upper end of the barrier layer.

4. The semiconductor device as claimed in claim 1, wherein a lower surface of the insulating pattern includes a flat surface contacting an upper surface of the lower landing pad and parallel to a lower surface of the substrate.

5. The semiconductor device as claimed in claim 1, wherein the side surface of the insulating pattern further includes a concave curved surface toward the upper landing pad.

6. The semiconductor device as claimed in claim 1, wherein an upper surface of the lower landing pad includes a flat surface contacting the insulating pattern and parallel to a lower surface of the substrate.

7. The semiconductor device as claimed in claim 1, wherein an upper end of the barrier layer is at a lower level than upper ends of the bit line structures.

8. The semiconductor device as claimed in claim 1, wherein a lower end of the upper landing pad is at a lower level than an upper surface of the lower landing pad and a lower surface of the insulating pattern.

9. The semiconductor device as claimed in claim 1, further comprising a metal-semiconductor compound layer between the contact plug and the lower landing pad.

10. The semiconductor device as claimed in claim 1, wherein:
the insulating pattern includes a first portion at a lower level than upper ends of the bit line structures, and a second portion at a higher level than the upper ends of the bit line structures, and
a horizontal width of the first portion is narrower than a horizontal width of the second portion.

11. The semiconductor device as claimed in claim 10, wherein:
the first portion includes a first side surface and a second side surface opposite to the first side surface,
the first side surface includes a concave curved surface toward the upper landing pad, and
the second side surface includes a concave curved surface toward an adjacent bit line structure among the bit line structures.

12. The semiconductor device as claimed in claim 10, wherein the first portion has a first horizontal width at a first level between an upper surface of the lower landing pad and upper ends of the bit line structures, a second horizontal width, wider than the first horizontal width, at a second level, higher than the first level, and a third horizontal width, wider than the first horizontal width at a third level, lower than the first level.

13. The semiconductor device as claimed in claim 10, wherein the horizontal width of the second portion decreases upwardly in a vertical direction.

14. The semiconductor device as claimed in claim 1, wherein an upper end of the barrier layer is at a lower level than an upper surface of the metal layer, and is spaced apart from a lower surface of the insulating pattern.

15. A semiconductor device, comprising:
a substrate including an active region;
a gate structure in the substrate, crossing the active region, the gate structure extending in a first horizontal direction;
bit line structures crossing the gate structure and extending in a second horizontal direction, the second direction intersecting the first horizontal direction;
a contact structure between the bit line structures and including a contact plug and a landing pad structure on the contact plug; and
an insulating pattern on the contact plug and contacting a side surface of the landing pad structure, a side surface of the insulating pattern including a concave curved surface toward an adjacent bit line structure among the bit line structures.

16. The semiconductor device as claimed in claim 15, wherein the landing pad structure includes a material identical to a material of the contact plug, and is integrally coupled to the contact plug.

17. The semiconductor device as claimed in claim 16, wherein a lower surface of the insulating pattern includes a flat surface contacting an upper surface of the contact plug and is parallel to an upper surface of the substrate.

18. The semiconductor device as claimed in claim 15, wherein the side surface of the insulating pattern includes a concave curved surface toward the landing pad structure.

19. A semiconductor device, comprising:

a substrate including an active region;

a gate structure in the substrate, the gate structure crossing the active region and extending in a first horizontal direction;

a first bit line structure and a second bit line structure crossing the gate structure and extending in a second horizontal direction, the second direction intersecting the first horizontal direction, and the first bit line structure and the second bit line structure are spaced apart from each other in the first horizontal direction;

spacer structures covering side surfaces of the first bit line structure and a side surface of the second bit line structure;

a first contact plug and a second contact plug alternately disposed with the first bit line structure and the second bit line structure;

a first landing pad structure and a second landing pad structure on the first contact plug and the second contact plug, respectively, the first landing pad structure and the second landing pad structure including a lower landing pad and an upper landing pad on the lower landing pad, respectively, and the lower landing pad includes a barrier layer and a metal layer on the barrier layer; and an insulating pattern between the first landing pad structure and the second landing pad structure, the upper landing pad being integrally coupled to the metal layer, and a side surface of the insulating pattern including a concave curved surface toward the second bit line structure.

20. The semiconductor device as claimed in claim 19, wherein an area of the insulating pattern contacting the first landing pad structure is larger than an area of the insulating pattern contacting the second landing pad structure.

* * * * *